(12) United States Patent
Foroutan et al.

(10) Patent No.: US 12,307,351 B2
(45) Date of Patent: May 20, 2025

(54) METHOD AND APPARATUS FOR TRIMMING SENSOR OUTPUT USING A NEURAL NETWORK ENGINE

(71) Applicant: Allegro MicroSystems, LLC

(72) Inventors: Vahid Foroutan, Bedford, NH (US); Khalid Chishti, Pepperell, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 639 days.

(21) Appl. No.: 17/015,332

(22) Filed: Sep. 9, 2020

(65) Prior Publication Data

US 2022/0076105 A1 Mar. 10, 2022

(51) Int. Cl.
*G06N 3/063* (2023.01)
*G06N 3/048* (2023.01)
*G06N 3/08* (2023.01)

(52) U.S. Cl.
CPC ............ *G06N 3/063* (2013.01); *G06N 3/048* (2023.01); *G06N 3/08* (2013.01)

(58) Field of Classification Search
CPC ........... G06N 3/063; G06N 3/048; G06N 3/08
See application file for complete search history.

(56) References Cited

U.S. PATENT DOCUMENTS

| | | | |
|---|---|---|---|
| 7,923,996 B2 | 4/2011 | Doogue et al. | |
| 8,030,918 B2 | 10/2011 | Doogue et al. | |
| 8,054,071 B2 | 11/2011 | Doogue et al. | |
| 8,350,563 B2 | 1/2013 | Haas et al. | |
| 8,680,846 B2 | 3/2014 | Cesaretti et al. | |
| 8,736,260 B2 | 5/2014 | Foletto et al. | |
| 8,773,123 B2 | 7/2014 | Doogue et al. | |
| 9,052,349 B2 | 6/2015 | Haas et al. | |
| 9,354,123 B2 | 5/2016 | Drouin et al. | |
| 9,395,391 B2 | 7/2016 | Fernandez et al. | |
| 9,442,170 B2 | 9/2016 | Drouin et al. | |
| 9,638,764 B2 | 5/2017 | Cesaretti et al. | |
| 9,644,999 B2 | 5/2017 | Foletto et al. | |
| 10,066,965 B2 | 9/2018 | Foletto et al. | |
| 10,162,017 B2 | 12/2018 | Cesaretti | |
| 10,636,285 B2 | 4/2020 | Haas et al. | |
| 10,746,818 B2 | 8/2020 | Cesaretti | |
| 10,845,434 B2 | 11/2020 | Fernandez et al. | |

(Continued)

FOREIGN PATENT DOCUMENTS

GB 2539681 12/2016

OTHER PUBLICATIONS

Sarvan et al. ("Implementation of ANN Training Module on Field Programmable Gate Arrays." 2019 Innovations in Intelligent Systems and Applications Conference (ASYU). IEEE, 2019). (Year: 2019).*

(Continued)

*Primary Examiner* — Michelle T Bechtold
*Assistant Examiner* — Moriam Mosunmola Godo
(74) *Attorney, Agent, or Firm* — Daly Crowley, Mofford & Durkee, LLP

(57) ABSTRACT

A sensor is provided, comprising: a first sensing element that is arranged to generate, at least in part, a first signal; a second sensing element that is arranged to generate, at least in part, a second signal; and a neural network circuit that is configured to output an adjusted signal based on the first signal and the second signal.

11 Claims, 20 Drawing Sheets

(56) References Cited

U.S. PATENT DOCUMENTS

| | | | |
|---|---|---|---|
| 11,009,565 | B2 | 5/2021 | Fernandez et al. |
| 2009/0259609 | A1* | 10/2009 | Dmytriw .................. G06N 3/02 706/22 |
| 2012/0303565 | A1* | 11/2012 | Deng ........................ G06N 3/08 706/25 |
| 2014/0046612 | A1 | 2/2014 | Andelic et al. |
| 2017/0011288 | A1* | 1/2017 | Brothers ............... G06F 9/3017 |
| 2019/0026250 | A1* | 1/2019 | Das Sarma ............ G06N 3/045 |
| 2020/0160161 | A1* | 5/2020 | Yoo ......................... G06N 3/04 |
| 2021/0026874 | A1* | 1/2021 | Ikeda ..................... G06N 3/084 |
| 2021/0034982 | A1* | 2/2021 | Sather .................... G06N 3/082 |
| 2021/0279561 | A1* | 9/2021 | Yoshida .................. G06N 3/08 |
| 2021/0390367 | A1* | 12/2021 | Liu ........................ G06N 3/045 |

OTHER PUBLICATIONS

Allegro MicroSystems LLC, Datasheet "A1340, A1341, and A1343 Sensor Temperature Compensation", May 3, 2016, 7 pages.

Foresee et al. "Gauss-Newton Approximation to Bayesian Learning", International Conference on Neural Networks, vol. 3, 1997, 6 pages.

Hagan et al. "Neural network design , $2^{nd}$ Edition", 1996, 1012 pages.

Hagan et al. "Training Feedforward Networks with the Marquardt Algorithm", IEEE, Transactions on Neural Networks 5, No. 6, Nov. 1994, 5 pages.

Hitotumatu "Complex arithmetic through CORDIC." In Kodai Mathematical Seminar Reports, vol. 26, No. 2-3, Department of Mathematics, Tokyo Institute of Technology, Jun. 4, 1973, 11 pages.

Kok et al. "Giant magnetoresistance (GMR): Spinning from Research to Advanced Technology", ASEAN Journal on Science and Technology for Development 19, No. 2, May 10, 2002, 12 pages.

Llamocca-Obregón et al. "A Fixed-Point Implementation of the Expanded Hyperbolic CORDIC Algorithm" Latin American Applied Research 37, No. 1, 2007, 10 pages.

MacKay et al. "Information Theory, Inference and Learning Algorithms", Cambridge University Press, Mar. 28, 2005, 640 pages.

MacKay et al. "A Practical Bayesian Framework for Backpropagation Networks" Neural Computation 4, No. 3, 1992, 25 pages.

Neal "Bayesian Learning for Neural Networks", Springer Science & Business Media, vol. 118, 2012, 195 pages.

Neal "Bayesian Training of Backpropagation Networks by the Hybrid Monte Carlo Method", Technical Report CRG-TR-92-1, Dept. of Computer Science, University of Toronto, Apr. 10, 1992, 21 pages.

Nguyen et al. "Improving the Learning Speed of 2-Layer Neural Networks by Choosing Initial Values of the Adaptive Weights", IEEE, IJCNN International Joint Conference on Neural Networks, 1990, 6 pages.

Raut et al. "A CORDIC based Configurable Activation Function for ANN Applications", IEEE Computer Society Annual Symposium on VLSI (ISVLSI), 2020, 6 psges.

Sutton et al. "Reinforcement learning: An introduction", MIT press, 2015, 352 pages.

Volder "The Birth of CORDIC", J. VLSI Signal Process., vol. 25, 2000, 5 pages.

Volder "The CORDIC Trigonometric Computing Technique", IRE Trans. Electron. Computers, vol. EC-8, 1959, 5 pages.

Walther "A unified algorithm for elementary functions." Proceedings of the May 18-20, 1971, Spring Joint Computer Conference, 7 pages.

Search Report and Written Opinion dated Nov. 4, 2021 for PCT Application No. PCT/US2021/042499; 27 pages.

International Preliminary Reporting on Patentability dated Mar. 23, 2023 for PCT Application No. PCT/US2021/042499; 9 pages.

Hagan et al "Training Feedforward Networks with the Marquardt Algorithm", IEEE Transactions on Neural Networks, vol. 5, No. 6, Nov. 1994, 5 pages.

Hu et al. "Expanding The Range Of Convergence Of The CORDIC Algorithm", IEEE Transactions on Computers, vol. 40, No. 1, Jan. 1991, 9 pages.

Communication pursuant to Rules 161(1) and 162 EPC dated Jan. 31, 2023 for European Application No. 21752455.2, 3 pages.

Response to Communication pursuant to Rules 161(1) and 162 EPC dated Jan. 31, 2023 filed on Jul. 6, 2023 for European Application No. 21752455.2, 20 pages.

Ishwaran "Applications of Hybrid Monte Carlo to Bayesian Generalized Linear Models: Quasicomplete Separation and Neural Networks" Journal of Computational and Graphical Statistics 8, No. 4, 1999, 20 pages.

Marquardt "An algorithm for least-squares estimation of nonlinear parameters." Journal of the society for Industrial and Applied Mathematics 11, No. 2, 1963, 12 pages.

* cited by examiner

METHOD AND APPARATUS FOR TRIMMING SENSOR OUTPUT USING A NEURAL NETWORK ENGINE

BACKGROUND

Neural networks are data processing systems including connected nodes that are loosely modeled on the anatomy of the cerebral cortex area of the brain. A neural network can be trained to perform various tasks relating to pattern recognition. Neural networks are widely used in artificial general intelligence, computer vision, and robotics.

SUMMARY

According to aspects of the disclosure, a sensor is provided, comprising: a first sensing element that is arranged to generate, at least in part, a first signal; a second sensing element that is arranged to generate, at least in part, a second signal, the second signal being indicative of an environmental condition that affects a sensitivity of the first sensing element; and a neural network circuit that is configured to adjust a gain of the first signal based on the second signal, the gain of the first signal being adjusted to compensate for variations in the sensitivity of the first sensing element that are caused by the environmental condition.

In an embodiment, the environmental condition includes at least one of temperature, humidity, and stress.

In an embodiment, the first sensing element includes at least one of a magnetic-field-sensing element, a pressure-sensing element, and a light-sensing element.

In an embodiment, the neural network circuit is configured to generate an adjustment coefficient based on the second signal, the adjustment coefficient being multiplied by the first signal to generate a gain-adjusted signal.

In an embodiment, the neural network circuit is configured to generate a gain-adjusted signal directly.

In an embodiment, the neural network circuit is configured to evaluate a neural network having a plurality of hidden nodes, any of the hidden nodes corresponding to an affine function having the form of: $Z=W*V_2+B$, where W is a weight associated with the hidden node, $V_2$ is a sample of the second signal, and B is a bias associated with the hidden node.

In an embodiment, the neural network circuit is configured to evaluate a neural network having a plurality of hidden nodes, any of the hidden nodes corresponding to an affine function having the form of:

$$Z = [W_1\ W_2]\begin{bmatrix} V_1 \\ V_2 \end{bmatrix} + B,$$

where $W_1$ is a weight associated with the hidden node, $W_2$ is a weight associated with the hidden node, $V_1$ is a sample of the first signal, $V_2$ is a sample of the second signal, and B is a bias associated with the hidden node.

In an embodiment, the neural network circuit is configured to evaluate a plurality of activation functions in a sequence, each of the activation functions corresponding to a different hidden node of a neural network.

In an embodiment, the neural network circuit includes a Coordinate Rotational Digital Computer (CORDIC) module that is arranged to sequentially evaluate the activation functions.

In an embodiment, the neural network circuit includes an addition unit and a lookup table that is arranged to output the respective value of any of the plurality of activation functions in a same clock cycle with the addition unit evaluating an affine function that corresponds to the same hidden node as the activation function.

According to aspects of the disclosure, a sensor is provided, comprising: a first sensing element that is arranged to generate, at least in part, a first signal; a second sensing element that is arranged to generate, at least in part, a second signal, the second signal being indicative of an environmental condition that affects a sensitivity of the first sensing element; and a processing circuitry including a neural network circuit and a multiplication unit, the neural network circuit being configured to generate an adjustment coefficient based on the second signal, and the multiplication unit being configured to generate a gain-adjusted signal by multiplying the first signal by the adjustment coefficient.

In an embodiment, the environmental condition includes at least one of temperature, humidity, and stress, and the first sensing element includes at least one of a magnetic-field-sensing element, a pressure-sensing element, and a light-sensing element.

In an embodiment, the neural network circuit is configured to evaluate a neural network having a plurality of hidden nodes, any of the hidden nodes corresponding to an affine function having the form of: $Z=W*V_2+B$, where W is a weight corresponding to the hidden node, $V_2$ is a sample of the second signal, and B is a bias corresponding to the hidden node.

In an embodiment, the neural network circuit is configured to evaluate a neural network having a plurality of hidden nodes, any of the hidden nodes corresponding to a respective affine function and a respective activation function, the respective activation function having the form of: $A=\tanh(Z)$, where A is a value of the respective activation function and Z is a value of the respective affine function.

In an embodiment, the neural network circuit is configured to evaluate a neural network having a plurality of hidden nodes and an output node, wherein each of hidden nodes corresponds to a respective affine function and a respective first activation function, and the output node corresponds to a second activation function having the form of: $C=\Sigma_i U_i*A_i$, where C is the adjustment coefficient, $U_i$ is a weight associated with the i-th hidden node in the plurality, $A_i$ is a value of the respective first activation function that corresponds to the i-th hidden node in the plurality.

According to aspects of the disclosure, a sensor is provided, comprising: a first sensing element that is arranged to generate, at least in part, a first signal; a second sensing element that is arranged to generate, at least in part, a second signal; and a processing circuitry including a neural network circuit and a multiplication unit, the neural network circuit being configured to generate an adjustment coefficient based on the second signal, and the multiplication unit being configured to generate a gain-adjusted signal by multiplying the first signal by the adjustment coefficient, wherein the neural network circuit is configured to evaluate a neural network having a plurality of hidden nodes, any of the hidden nodes corresponding to an affine function having the form of: $Z=W*V_2+B$, where W is a weight corresponding to the hidden node, $V_2$ is a sample of the second signal, and B is a bias corresponding to the hidden node.

In an embodiment, any of the hidden nodes corresponds to a respective first activation function and a respective affine function, the respective first activation function having the form of: A=tanh (Z), where A is the value of the first activation function and Z is the value of the respective affine function.

In an embodiment, the neural network includes an output node, the output node corresponding to a second activation function having the form of: $C=\Sigma_i U_i*A_i$, where C is the adjustment coefficient, $U_i$ is a weight associated with the i-th hidden node in the plurality, and $A_i$ is a value of the respective first activation function that corresponds to the i-th hidden node in the plurality.

In an embodiment, the second signal being indicative of an environmental condition that affects a sensitivity of the first sensing element.

In an embodiment, the first sensing element includes at least one of a magnetic-field-sensing element, a pressure-sensing element, and a light-sensing element.

According to aspects of the disclosure, a sensor is provided, comprising: a first sensing element that is arranged to generate, at least in part, a first signal; a second sensing element that is arranged to generate, at least in part, a second signal; and a neural network circuit that is configured to output an adjusted signal based on the first signal and the second signal.

In an embodiment, the neural network circuit is configured to evaluate a neural network having a plurality of hidden nodes, any of the hidden nodes corresponding to an affine function having the form of:

$$Z = = [W_1\ W_2]\begin{bmatrix} V_1 \\ V_2 \end{bmatrix} + B,$$

where $W_1$ is a weight associated with the hidden node, $W_2$ is a weight associated with the hidden node, $V_1$ is a sample of the first signal, $V_2$ is a sample of the second signal, and B is a bias associated with the hidden node.

In an embodiment, the neural network circuit is configured to evaluate a neural network having a plurality of hidden nodes, any of the hidden nodes corresponding to a respective affine function and a respective activation function, the respective activation function having the form of: A=tanh (Z), where A is a value of the respective activation function and Z is a value of the respective affine function.

In an embodiment, the neural network circuit is configured to evaluate a neural network having a plurality of hidden nodes and an output node, wherein each of hidden nodes corresponds to a respective affine function and a respective first activation function, and the output node corresponds to a second activation function having the form of: $V_{out}=\Sigma_i U_i*A_i$, where $V_{out}$ is the gain-adjusted signal that is output by the neural network circuit, $U_i$ is a weight associated with the i-th hidden node in the plurality, $A_i$ is a value of the respective first activation function that corresponds to the i-th hidden node in the plurality.

In an embodiment, the neural network circuit is configured to evaluate a neural network having a plurality of hidden nodes, each of the hidden nodes corresponding to a different one of a plurality of activation functions, the neural network circuit includes a plurality of registers, each of the plurality of registers being arranged to store a value of a different one of the plurality of activation functions, and the neural network is arranged to sequentially calculate respective values of the plurality of activation functions and store the respective values in the plurality of registers.

In an embodiment, the neural network circuit is configured to evaluate a plurality of activation functions in a sequence, each of the activation functions corresponding to a different hidden node of a neural network, and the neural network circuit includes an addition unit and a lookup table that is arranged to output the respective value of any of the plurality of activation functions in a same clock cycle with the addition unit evaluating an affine function that corresponds to a same hidden node as the activation function.

In an embodiment, the second signal is indicative of an environmental condition that affects a sensitivity of the first sensing element, and the neural network circuit is arranged to compensate for variations in the sensitivity of the first sensing element that are caused by the environmental condition.

In an embodiment, the environmental condition includes at least one of temperature, humidity, and stress, and the first sensing element includes at least one of a magnetic-field-sensing element, a pressure-sensing element, and a light-sensing element.

In an embodiment, wherein the first sensing element includes a giant magnetoresistance (GMR) element and the second sensing element includes a temperature-sensing element.

In an embodiment, wherein the first sensing element includes a magnetic-field-sensing element and the second sensing element includes a temperature-sensing element.

According to aspects of the disclosure, a sensor is provided, comprising: a first sensing element that is arranged to generate, at least in part, a first signal; a second sensing element that is arranged to generate, at least in part, a second signal; and a neural network circuit that is configured to adjust the first signal based on the second signal, wherein the neural network circuit is configured to evaluate a neural network having a plurality of hidden nodes, any of the hidden nodes corresponding to an affine function having the form of:

$$Z = [W_1\ W_2]\begin{bmatrix} V_1 \\ V_2 \end{bmatrix} + B,$$

where $W_1$ is a weight associated with the hidden node, $W_2$ is a weight associated with the hidden node, $V_1$ is a sample of the first signal, $V_2$ is a sample of the second signal, and B is a bias associated with the hidden node In an embodiment, any of the hidden nodes further includes a respective first activation function having the form of: A=tanh (Z), where A is a value of the respective first activation function and Z is a value of the hidden node's corresponding affine function.

In an embodiment, the neural network includes an output node, the output node including a second activation function having the form of: $V_{out}=\Sigma_i U_i*A_i$, where $V_{out}$ is an adjusted signal that is output by the neural network circuit, $U_i$ is a weight associated with the i-th hidden node in the plurality, $A_i$ is a value of the respective first activation function that corresponds to the i-th hidden node in the plurality.

In an embodiment, the second signal is indicative of an environmental condition that affects a sensitivity of the first sensing element, and the neural network circuit is arranged to compensate for variations in the sensitivity of the first sensing element that are caused by the environmental condition.

In an embodiment, the environmental condition includes at least one of temperature, humidity, and stress, and the first sensing element includes at least one of a magnetic-field-sensing element, a pressure-sensing element, and a light-sensing element.

According to aspects of the disclosure, a sensor is provided, comprising: a first sensing element that is arranged to generate, at least in part, a first signal; a second sensing element that is arranged to generate, at least in part, a second signal, the second signal being indicative of an environmental condition; and a neural network circuit that is configured to adjust the first signal based on the second signal, wherein the neural network circuit is configured to correct the first signal for changes in a sensitivity of the first sensing element that are caused by the environmental condition.

In an embodiment, the environmental condition includes at least one of temperature, humidity, and stress.

In an embodiment, the first sensing element includes a Giant Magnetoresistance (GMR) element, and the second sensing element includes a temperature-sensing element.

In an embodiment, the neural network circuit is configured to evaluate a neural network having a plurality of hidden nodes, any of the hidden nodes corresponding to an affine function having the form of:

$$Z = [W_1\ W_2]\begin{bmatrix} V_1 \\ V_2 \end{bmatrix} + B,$$

where $W_1$ is a weight associated with the hidden node, $W_2$ is a weight associated with the hidden node, $V_1$ is a sample of the first signal, $V_2$ is a sample of the second signal, and B is a bias associated with the hidden node.

In an embodiment, the neural network circuit is configured to evaluate a neural network having a plurality of hidden nodes, any of the hidden nodes corresponding to a respective affine function and a respective activation function, the respective activation function having the form of: A=tanh (Z), where A is a value of the respective activation function and Z is a value of the respective affine function.

According to aspects of the disclosure, an apparatus is provided, comprising: a neural network circuit that is configured to receive a first signal from a first sensing element and output an adjusted signal based on the first signal.

In an embodiment, the first sensing element is integrated into the apparatus or is separate from the apparatus.

In an embodiment, the neural network circuit is configured to evaluate a neural network having a plurality of hidden nodes, any of the hidden nodes corresponding to a respective affine function having the form of: $Z=WV_1+B$ where W is a weight associated with the hidden node, $V_1$ is a sample of the first signal, and B is a bias associated with the hidden node.

In an embodiment, the neural network circuit is configured to evaluate a neural network having a plurality of hidden nodes, any of the hidden nodes corresponding to a respective affine function and a respective activation function, the respective activation function having the form of: A=tanh (Z) where A is a value of the respective activation function and Z is a value of the respective affine function.

In an embodiment, the first sensing element includes a magnetic field sensing element.

In an embodiment, the neural network circuit is configured to bring the first signal within a desired range.

In an embodiment, the neural network circuit is configured to bring the first signal within a desired linear range.

In an embodiment, the neural network circuit is further configured to receive a second signal from a second sensing element, and the adjusted signal is generated further based on the second signal.

In an embodiment, the second sensing element is integrated into the apparatus or is separate from the apparatus.

In an embodiment, the neural network circuit is configured to evaluate a neural network having a plurality of hidden nodes, any of the hidden nodes corresponding to a respective affine function having the form of:

$$Z = [W_1\ W_2]\begin{bmatrix} V_1 \\ V_2 \end{bmatrix} + B$$

where $W_1$ is a weight associated with the hidden node, $W_2$ is a weight associated with the hidden node, $V_1$ is a sample of the first signal, $V_2$ is a sample of the second signal, and B is a bias associated with the hidden node.

In an embodiment, the second signal is indicative of an environmental condition that affects a sensitivity of the first sensing element, and the neural network circuit is arranged to compensate for variations in the sensitivity of the first sensing element that are caused by the environmental condition.

BRIEF DESCRIPTION OF THE DRAWINGS

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

Figure 1A:
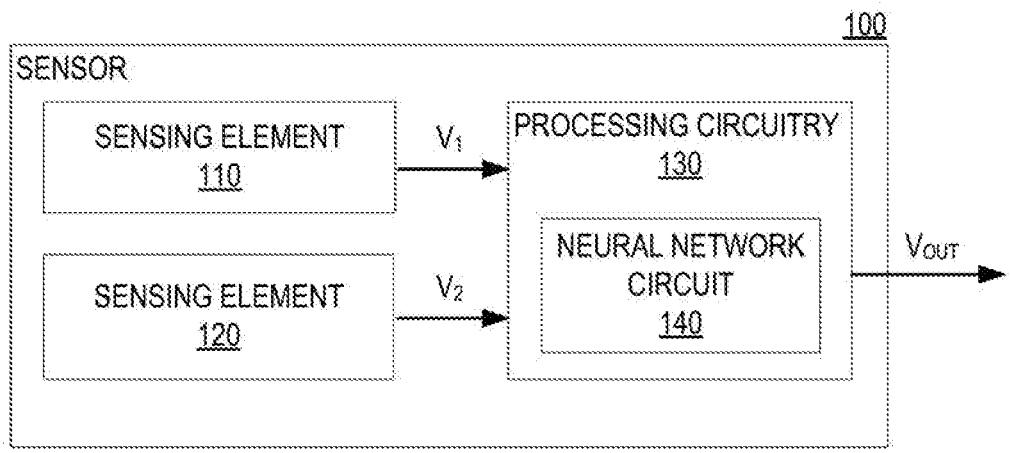
FIG. 1A is a diagram of an example of a sensor, according to aspects of the disclosure.

FIG. 1A is a diagram of an example of a sensor 100, according to aspects of the disclosure. The sensor 100 may include a magnetic field sensor (e.g., an angle sensor, a current sensor, etc.), a pressure sensor, an optical sensor, a chemical sensor, and/or any other suitable type of sensor. The sensor 100 may include a sensing element 110 and a sensing element 120. The sensing element 110 is arranged to generate a voltage signal $V_1$ and the sensing element 120 is arranged to generate a voltage signal $V_2$. The sensing element 110 may include any suitable type of sensing element, such as a magnetic-field-sensing element, a pressure-sensing element, a light-sensing element (e.g., a photodiode), and/or any other suitable type of sensing element. The sensing element 120 may include any suitable type of sensing element, such as a temperature-sensing element, a stress-sensing element, a humidity-sensing element.

The sensor 100 may further include a processing circuitry 130 that includes a neural network circuit 140. The neural network circuit 140 may be arranged to adjust the gain of the signal $V_1$ based on the signal $V_2$. More particularly, the sensing element 120 may be arranged to measure a condition of the environment of the sensing element 110 that affects the sensitivity of the sensing element 110, such as temperature, stress, humidity, etc. The neural network circuit 140 may adjust the gain of the signal $V_1$ (based on the signal $V_2$) to correct for variations in the sensitivity of the sensing element 110 that are caused by changes in the environmental condition. For example, in some implementations, the sensing element 110 may be a magnetic-field-sensing element (e.g., a Hall element, a giant magnetoresistance (GMR) element, a tunnel magnetoresistance (TMR) element, an anisotropic magnetoresistance (AMR) element, a magnetic tunnel junction (MTJ) element, etc.), and the sensing element 120 may be a temperature-sensing element (e.g., a thermistor), etc. In such implementations, the neural network circuit 140 may adjust the gain of the signal $V_1$ (which is generated by the sensing element 110) to compensate for variations in the sensitivity of the sensing element 110 that occur with changes in the temperature of the sensing element 110.

According to aspects of the disclosure, the sensing element 110 may include one or more transducers (e.g., one or more Hall plates, one or more GMR elements, etc). For example, in some implementations, the sensing element 110 may include a bridge circuit (e.g., a half-bridge or full-bridge circuit). Although FIG. 1A depicts the sensing element 110 as being directly connected to the processing circuitry 130, it will be understood that, in some implementations, there may be other circuitry interposed between the processing circuitry 130 and the sensing element 110. By way of example, such circuitry may include one or more of an amplifier, a modulator circuit, a filter circuit, etc. The signal $V_1$ may include any suitable type of signal that is generated at least in part by the sensing element 110. For example, the signal $V_1$ may be one that is generated directly by the sensing element 110. As another example, the signal $V_1$ may be a signal generated by other circuitry that is interposed between the sensing element 110 and the processing circuitry 130, based on a signal provided by the sensing element 110.

Figure 1B:
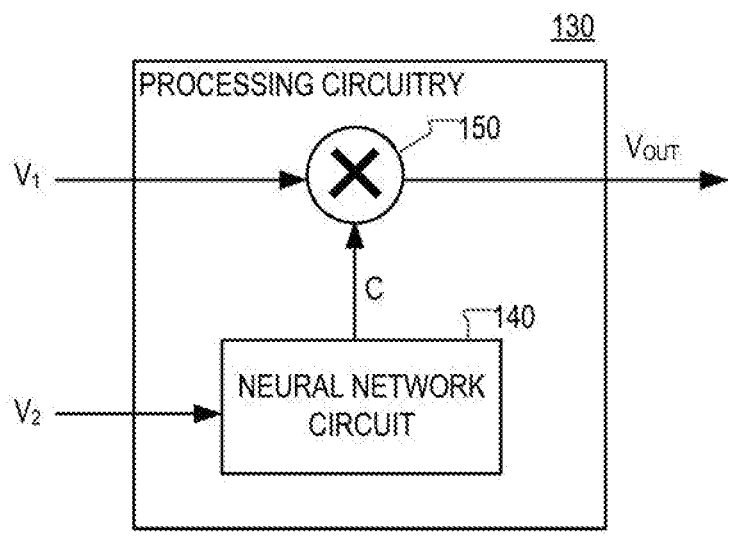
FIG. 1B is a diagram illustrating the operation of a neural network circuit that is part of the sensor of FIG. 1A, according to aspects of the disclosure.

According to aspects of the disclosure, the sensing element 120 may include one or more transducers (e.g., one or more temperature sensors, etc.) Additionally or alternatively, in some implementations, the sensing element 120 may include a bridge circuit (e.g., a half-bridge or a full-bridge circuit, etc.). Although FIG. 1B depicts the sensing element 120 as being directly connected to the processing circuitry 130, it will be understood that, in some implementations, there may be other circuitry interposed between the processing circuitry 130 and the sensing element 120. By way of example, such circuitry may include one or more of an amplifier, a modulator circuit, a filter circuit, etc. The signal $V_2$ may include any suitable type of signal that is generated at least in part by the sensing element 120. For example, the signal $V_2$ may be one that is generated directly by the sensing element 120. As another example, the signal $V_2$ may be a signal generated by other circuitry that is interposed between the sensing element 120 and the processing circuitry 130, based on a signal provided by the sensing element 120.

FIG. 1B shows the operation of the neural network circuit 140 in further detail. The neural network circuit 140 may receive the signal $V_2$ and generate an adjustment coefficient C based on the signal $V_2$. Afterwards, the neural network circuit 140 may provide the adjustment coefficient C to a multiplication element 150, which is also part of the processing circuitry 130. The multiplication element 150 may multiply the signal $V_1$ by the adjustment coefficient C and generate a gain-adjusted signal $V_{out}$ as a result. According to the present example, the signal $V_{out}$ is output directly from the sensor 100. However, it will be understood that alternative implementations are possible in which further processing is performed on the signal $V_{out}$ before the signal $V_{out}$ is output from the sensor 100.

Stated succinctly, the sensing element 110 may be arranged to generate the signal $V_1$, which is indicative of the level of a specific stimulus, such as magnetic field density, magnetic field direction, light intensity, light color, etc. The sensing element 120 may be arranged to generate the signal $V_2$ that is indicative of an environmental condition that affects the sensitivity of the sensing element 110, such as temperature, humidity, stress, and/or any other condition. The neural network circuit 140 may be arranged to adjust the gain of the signal $V_1$ to compensate (or correct) for changes in the sensitivity of the sensing element 110 that are caused by the environmental condition. As noted above, the neural network circuit 140 may, at least in part, adjust the gain of the signal $V_1$ to produce a gain-adjusted signal $V_{out}$. The neural network circuit 140, in other words, may dynamically calibrate the signal output from the sensing element 110 based on cotemporaneous measurements of an environmental condition (obtained from the sensing element 120) in order to bring the signal in conformance with a given signal processing framework.

Figure 2A:
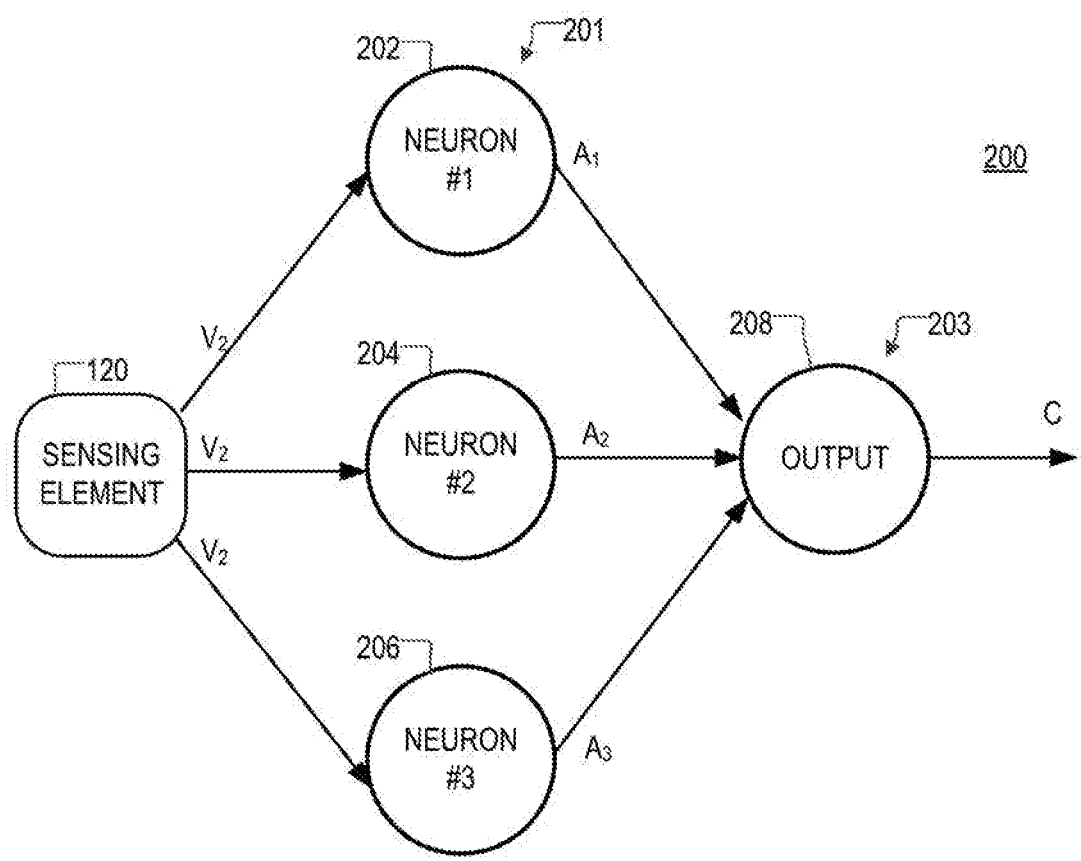
FIG. 2A is a diagram of an example of a neural network that is implemented by the neural network circuit of FIG. 1, according to aspects of the disclosure.
Figure 2B:
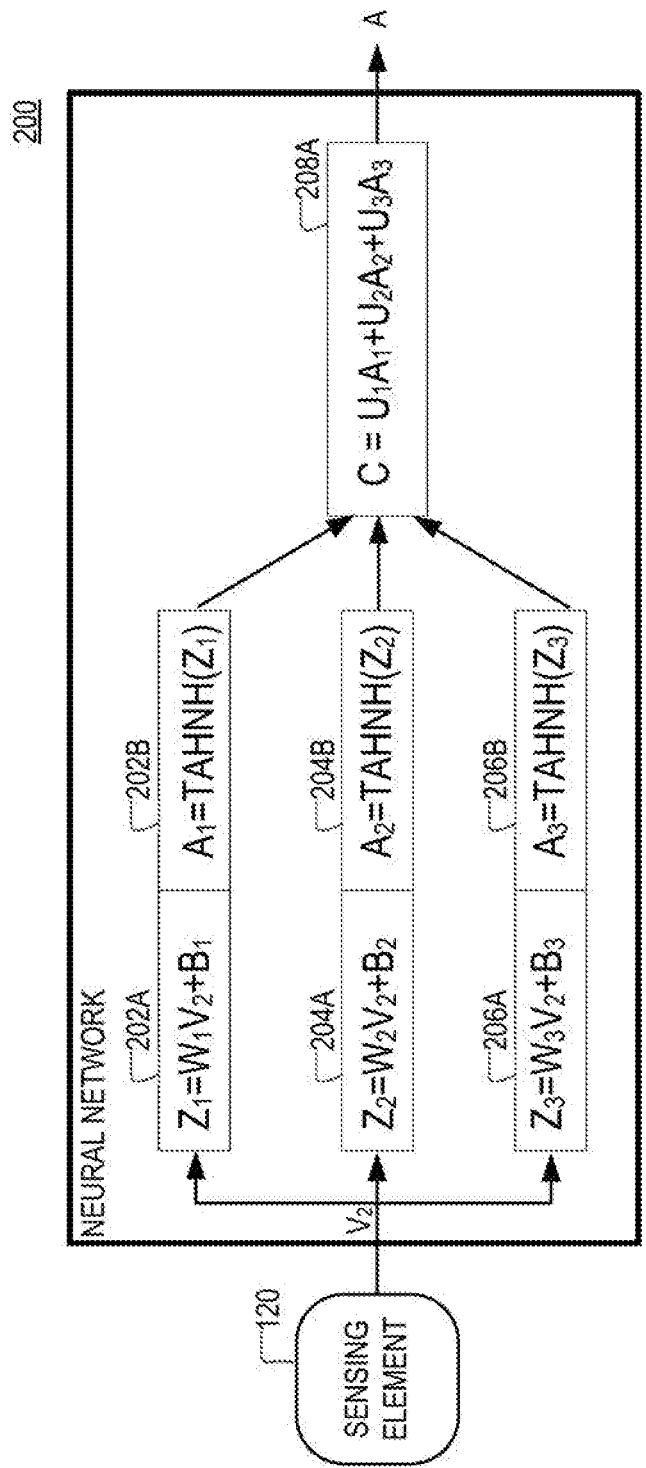
FIG. 2B is a diagram showing the neural network of FIG. 2A in further detail, according to aspects of the disclosure.

FIGS. 2A-B show a neural network 200, which is implemented by the neural network circuit 140. The neural network 200 may receive, as input, a value $V_2$ and output the adjustment coefficient C. The adjustment coefficient C may be used to adjust the gain of the signal $V_1$ (see FIGS. 1A-B). The value $V_2$ may include a digitized sample of the signal $V_2$. As used throughout the disclosure, the terms "value $V_2$" and "signal $V_2$" are used interchangeably. Similarly, as used throughout the disclosure, the terms "value $V_1$" and "signal $V_1$" are also used interchangeably.

The neural network 200 may include a hidden layer 201 and an output layer 203. The hidden layer 201 may include neurons 202, the 204, and 206 and the output layer 203 may include a neuron 208. The neuron 202 may include an affine function 202A and an activation function 202B. The neuron 204 may include an affine function 204A and an activation function 204B. And the neuron 206 may include an affine function 206A and an activation function 206B. The neuron 208 may include an activation function 208A. Although in the example of FIG. 2A, the hidden layer 201 includes three neurons, it will be understood that the present disclosure is not limited to any number of neurons being present in the hidden layer 201. Throughout the present application, the terms "neuron" and "node" are used interchangeably.

According to the example of FIGS. 2A-B, the affine function 202A may generate a value $Z_1$ by multiplying a weight $W_1$ by the value $V_2$ and adding a bias coefficient $B_1$ to the resulting product. The activation function 202B may generate an activation value $A_1$ by calculating the hyperbolic tangent of the value $Z_1$. The affine function 204A may generate a value $Z_2$ by multiplying a weight $W_2$ by the value $V_2$ and adding a bias coefficient $B_2$ to the resulting product. The activation function 204B may generate an activation value $A_2$ by calculating the hyperbolic tangent of the value $Z_2$. The affine function 206A may generate a value $Z_3$ by multiplying a weight $W_3$ by the value $V_2$ and adding a bias coefficient $B_3$ to the resulting product. The activation function 206B may generate an activation value $A_3$ by calculating the hyperbolic tangent of the value $Z_3$. The activation function 208A may calculate the adjustment coefficient C by multiplying the activation values $A_1$, $A_2$, and $A_3$ by respective weights $U_1$, $U_2$, and $U_3$, and summing up the resulting products. Although in the example of FIG. 2B, the activation function 208A is defined as $C=U_1A_1+U_2A_2+U_3A_3$, it will be understood that in some implementations, the activation function 208A can be generalized as $C=\Sigma_i U_i * A_i$.

According to the present example, the weights $W_1$, $W_2$, and $W_3$ are different from one another, however it will be understood that the present disclosure is not limited thereto. According to the present example, the bias coefficients $B_1$, $B_2$, and $B_3$ are different from one another, however it will be understood that the present disclosure is not limited thereto. According to the present example, the weights $U_1$, $U_2$, and $U_3$ are different from one another, however it will be understood that the present disclosure is not limited thereto. According to the present example, each of the weights $W_1$, $W_2$, $W_3$, each of the weights $U_1$, $U_2$, and $U_3$, and each of the bias coefficients $B_1$, $B_2$, and $B_3$ is a real number. According to the present example, the neural network 200 is trained by using a supervised learning algorithm. However, it will be understood that the present disclosure is not limited to any specific method for training the neural network 200. An example of a process for training the neural network 200 is discussed further below with respect to FIG. 10.

Figure 3A:
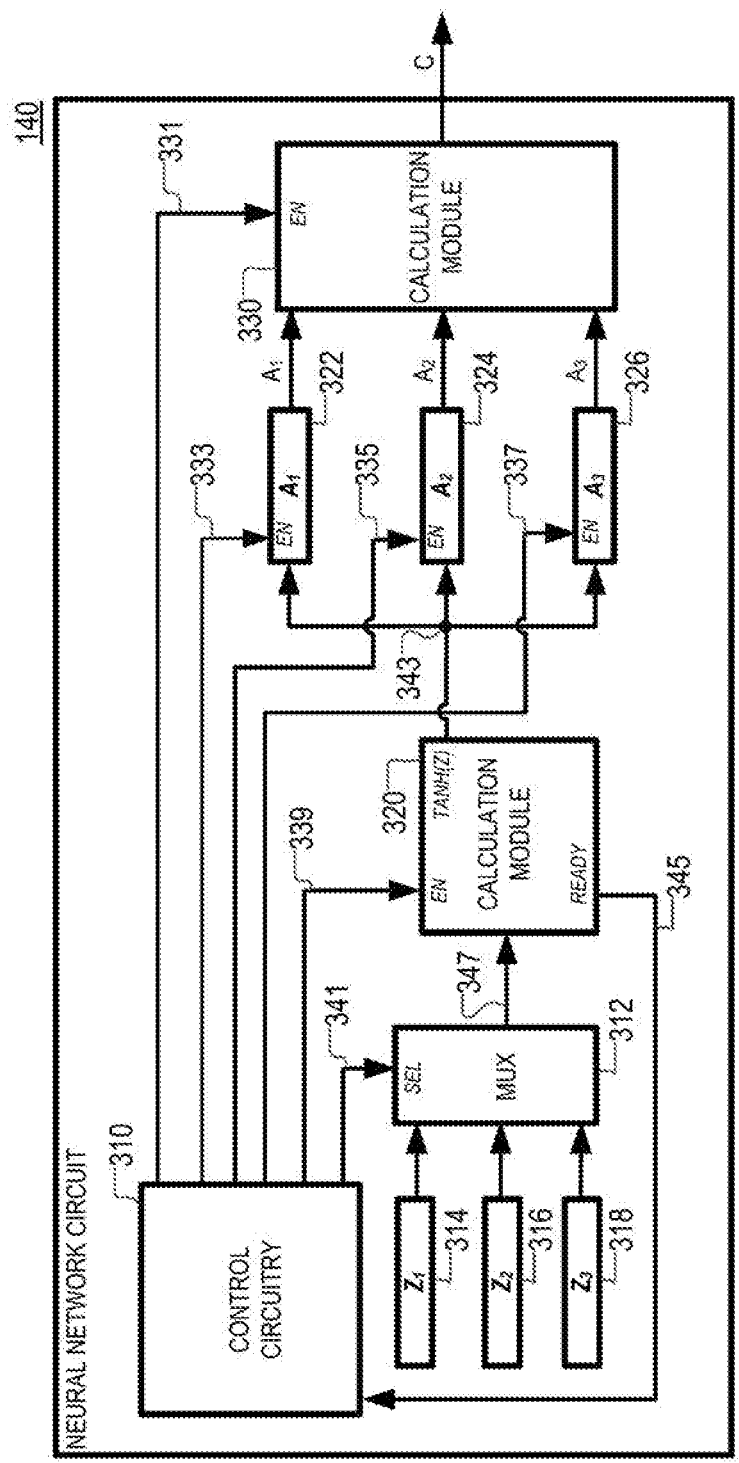
FIG. 3A is a diagram illustrating the neural network circuit of FIG. 1B, according to aspects of the disclosure.

FIG. 3A is a diagram illustrating an example of one possible implementation of the neural network circuit 140. According to the example of FIG. 3A, the neural network circuit 140 may include a control circuitry 310, a multiplexer, a calculation module 320, a calculation module 330, a register 322, a register 324, and a register 326.

The multiplexer 312 may include a 3×1 multiplexer. The multiplexer 312 may receive the values $Z_1$, $Z_2$, and $Z_3$ at its input. The value $Z_1$, $Z_3$, and $Z_3$ may be calculated by evaluating the affine functions 202A, 204A, and 206A, respectively (see FIG. 2B). The values $Z_1$, $Z_2$, and $Z_3$ may be stored in registers 314, 316, and 318, respectively by the control circuitry 310 and/or other circuitry (not shown).

In operation, the multiplexer 312 may receive a selection signal 341 from the control circuitry 310, which causes the multiplexer 312 to provide (on signal line 347) a selected one of the values $Z_1$, $Z_2$, and $Z_3$ to the calculation module 320. The calculation module 320 may include any suitable type of electronic circuitry that is arranged to evaluate the activation functions 202B, 204B, and 206B and calculate the activation values $A_1$, $A_2$, and $A_3$, respectively (shown in FIG. 2B). In other words, the calculation module 320 may be configured to calculate the hyperbolic tangent of any of the values $Z_1$, $Z_2$, and $Z_3$, which is provided to the calculation module 320 by the multiplexer 312. The values $Z_1$, $Z_2$, and $Z_3$ may be provided to the calculation module 320 in sequence. And similarly, the values $A_1$, $A_2$, and $A_3$ may be calculated in sequence. After they are calculated, the values $A_1$, $A_2$, and $A_3$ may be stored in registers 322, 324, and 326, respectively.

The calculation module 330 may include any suitable type of electronic circuitry that is arranged to evaluate the active function 208A (shown in FIG. 2B). In operation, the calculation module 330 may receive the active values $A_1$, $A_2$, and $A_3$, from registers 322, 324, and 326, and calculate the adjustment coefficient C. Afterwards, the calculation module 330 may output the adjustment coefficient C, as shown.

An example of a process that is performed by the neural network circuit 140 is now described in further detail. The process begins by the control circuitry 310 setting the selection signal 341 to a first value, which causes the multiplexer 312 to provide the value $Z_1$ to the calculation module 320. Next, the control circuitry 310 enables the calculation module 320 (via the signal 339), and the calculation module 320 calculates the value of $A_1$ based on the value $Z_1$ and outputs the value of $A_1$ on signal line 343. Next, the calculation module 320 sets the signal 345 to a first value (e.g., a logic-high value), which tells the control circuitry 310 that the value $A_1$ has been calculated and is ready to be stored in the register 322. In response to detecting that the signal 345 is set to the first value, the control circuitry 310 sets the signal 333 to a first value (e.g., a logic-high value), while keeping the signals 335 and 337 at a second value (e.g., a logic-low value). As a result of setting the signal 333 to the first value, the value $A_1$ is stored in register 322.

Next, the control circuitry 310 sets the selection signal 341 to a second value, which causes the multiplexer 312 to provide the value $Z_2$ to the calculation module 320. Next, the control circuitry 310 enables the calculation module 320 (via the signal 339), and the calculation module 320 calculates the value of $A_2$ based on the value $Z_2$ and outputs the value of $A_2$ on signal line 343. Next, the calculation module 320 sets the signal 345 to a first value (e.g., a logic-high value), which tells the control circuitry 310 that the value $A_2$ has been calculated and is ready to be stored in the register 324.

In response to detecting that the signal 345 has been set to the first value, the control circuitry 310 may set the signal 335 to a first value (e.g., a logic-high value), while keeping the signals 333 and 337 at a second value (e.g., a logic-low value). As a result of setting the signal 335 to the first value, the value $A_2$ is stored in register 324.

Next, the control circuitry 310 sets the selection signal 341 to a third value, which causes the multiplexer 312 to provide the value $Z_3$ to the calculation module 320. Next, the control circuitry 310 enables the calculation module 320 (via the signal 339), and the calculation module 320 calculates the value of $A_3$ based on the value $Z_3$ and outputs the value of $A_3$ on signal line 343. Next, the calculation module 320 sets the signal 345 to a first value (e.g., a logic-high value), which tells the control circuitry 310 that the value $A_3$ has been calculated and is ready to be stored in the register 326. In response to detecting that the signal 345 is set to the first value, the control circuitry 310 sets the signal 337 to a first value (e.g., a logic-high value), while keeping the signals 333 and 335 at a second value (e.g., a logic-low value). As a result of setting the signal 337 to the first value, the value $A_3$ is stored in register 326.

And finally, the control circuitry 310 sets the signal 331 to a logic high value, which causes the calculation module 330 to retrieve the values $A_1$, $A_2$, and $A_3$ from registers 322, 324, and 326, respectively, and calculate the adjustment coefficient C. As noted above, the adjustment coefficient may be calculated by evaluating the active function 208A, which is discussed above with respect to FIG. 2B.

Figure 3B:
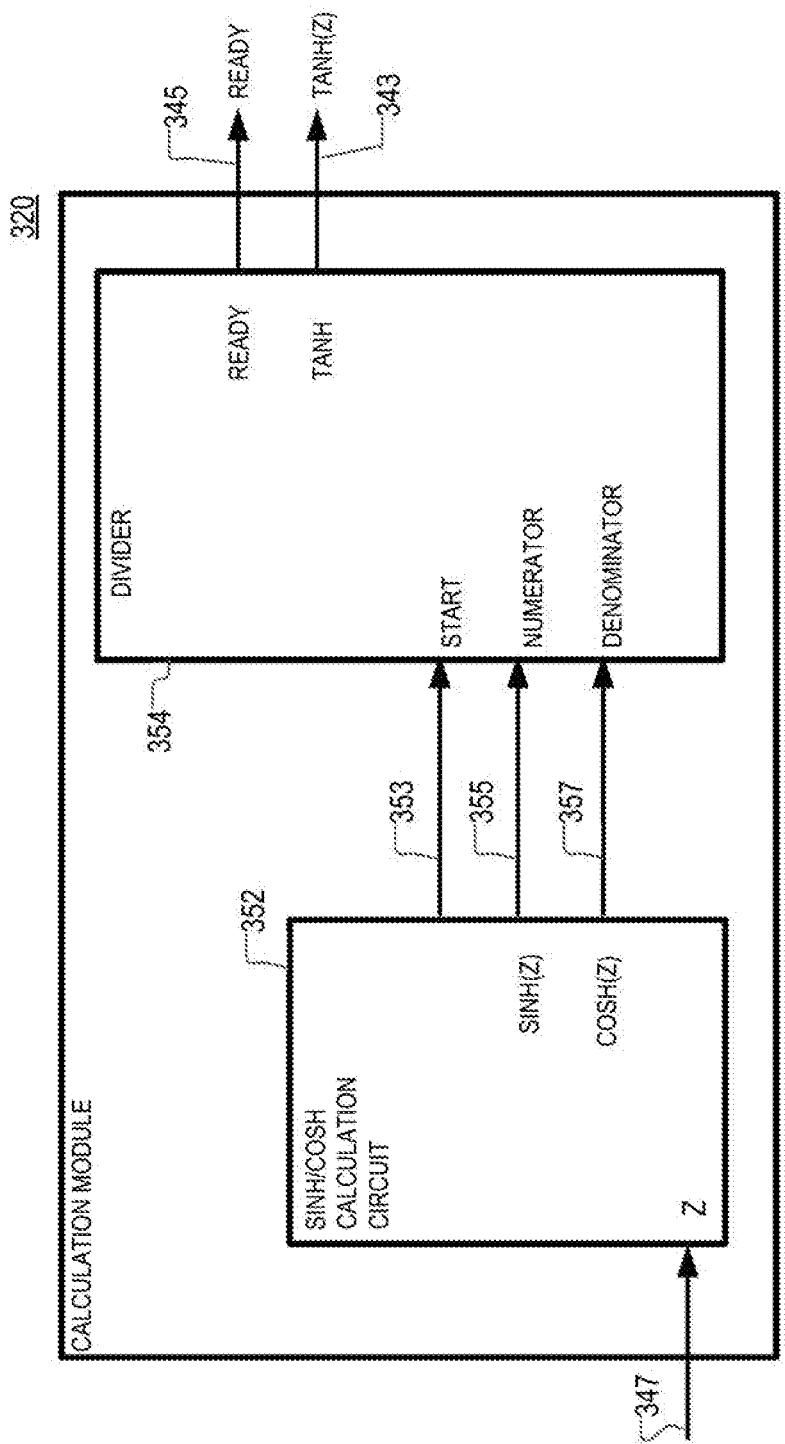
FIG. 3B is a diagram of an example of an evaluator that is part of the neural network circuit of FIG. 3A, according to aspects of the disclosure.

FIG. 3B is a diagram of the calculation module 320, in accordance with one particular implementation. As illustrated, the calculation module 320 may include a calculation circuit 352 and a divider 354. The calculation circuit 352 may include any suitable type of electronic circuitry that is arranged to receive (on signal line 347) a value Z (e.g., one of the values $Z_1$, $Z_2$, and $Z_3$) and calculate the hyperbolic cosine of Z (i.e., cosh(Z)) and the hyperbolic sine of Z (i.e., sinh(Z)). The calculation unit 352 may provide the values of sinh(Z) and cosh(Z) on lines 355 and 357, respectively. The divider 354 may include any suitable type of electronic circuitry that is configured to receive the values of sinh(Z) and cosh(Z), which are calculated by the calculation circuit 352, and calculate the value of the hyperbolic tangent of Z (i.e., tanh(Z)) by dividing the received values. Afterwards, the divider 354 may output the value of tanh(Z) on signal line 343 and set the value of the signal 345 to the first value (e.g., a logic-high value).

Figure 3C:
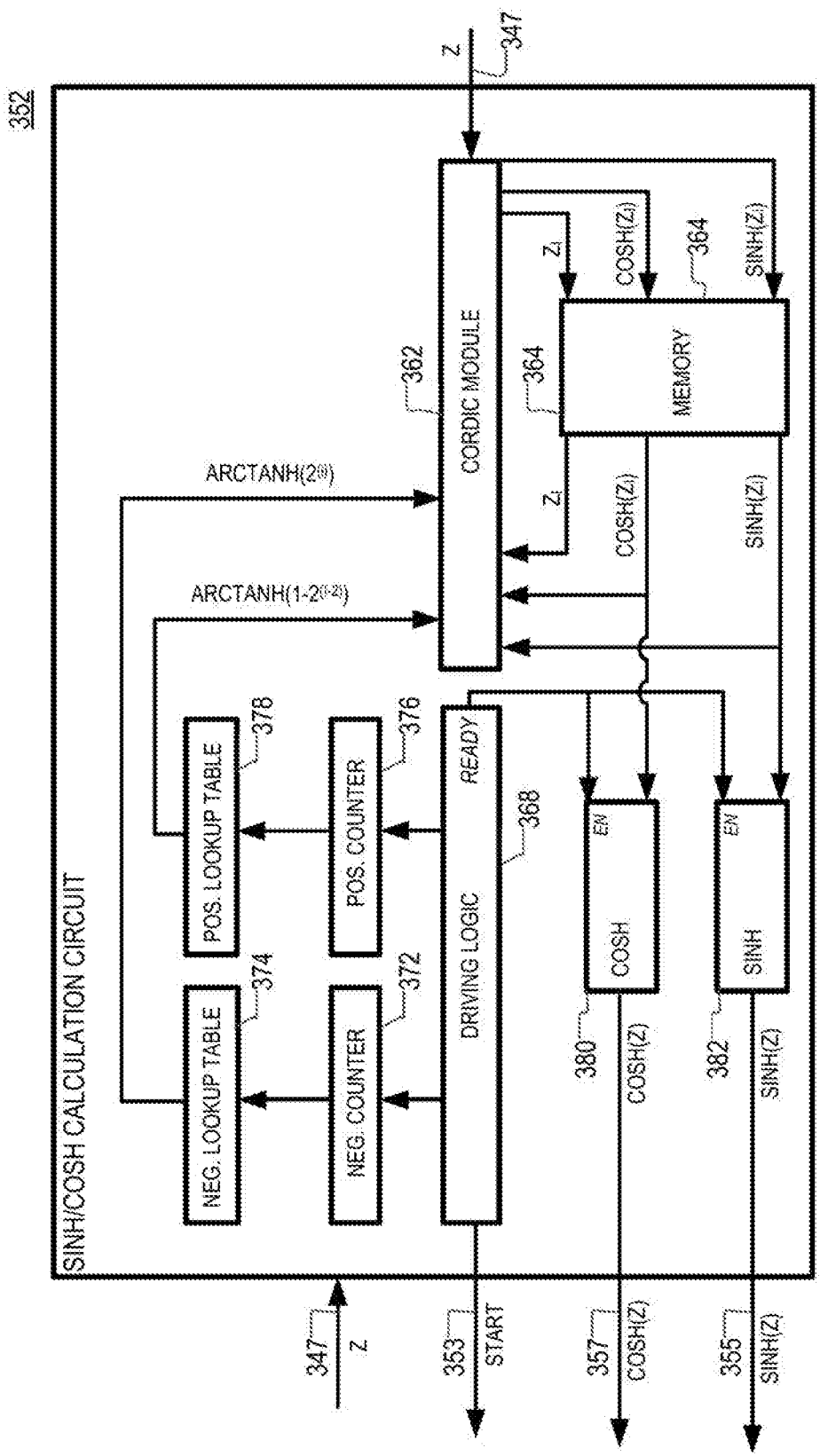
FIG. 3C is a diagram of an example of a calculation circuit that is part of the evaluator of FIG. 3B, according to aspects of the disclosure.

FIG. 3C is a diagram of the calculation circuit 352, in accordance with one particular implementation. The calculation circuit 352 uses the Coordinate Rotational Digital Computer (CORDIC) algorithm with an extended convergence range. The algorithm is described in Hu, Xiaobo et. al, *"Expanding the range of convergence of the CORDIC algorithm,"* IEEE Transactions on Computers 1 (1991): 13-21, which is herein incorporated by reference. The algorithm is described by Equations 1-12, below:

For $i > 0$: (Eq. 1)

$x_{i+1} = x_i + \delta_i 2^{-i} y_i$ $y_{i+1} = y_i + \delta_i 2^{-i} x_i$ (Eq. 2)

$z_{i+1} = z_i - \delta_i \text{arctanh}(2^{-i})$ (Eq. 3)

For $i \leq 0$ (Eq. 4)

$x_{i+1} = x_i + \delta_i(1 - 2^{i-2})y_i$ $y_{i+1} = y_i + \delta_i(1 - 2^{i-2})x_i$ (Eq. 5)

$z_{i+1} = z_i - \delta_i \text{arctanh}(1 - 2^{i-2})$ (Eq. 6)

$x_n = K_n(x_0 \cosh(z_0) + y_0 \sinh(z_0))$ (Eq. 7)

$y_n = K_n(y_0 \cosh(z_0) + x_0 \sinh(z_0))$ (Eq. 8)

$K_n = \left(\prod_{i=-M}^{0} \sqrt{1-(1-2^{i-2})}\right)\left(\prod_{i=1}^{n} \sqrt{1-2^{-2i}}\right)$ (Eq. 9)

$i = -m, \ldots, -2, -1, 0, 1, 2, \ldots, n-1$ (Eq. 10)

$z_{-m} = Z$ (Eq. 11)

$\delta_i = \begin{cases} -1 \text{ if } z_i < 0 \\ 1 \text{ if } z_i \geq 0 \end{cases}$ (Eq. 12)

where m is an integer, n is an integer, and Z can be any of the values $Z_1$, $Z_2$, and $Z_3$, which are calculated by evaluating affine functions, 202A, 204A, and 206A, respectively. (See FIG. 2B).

The calculation circuit 352 may include a negative lookup table 374 and a positive lookup table 378. The negative lookup table 374 may include any suitable type of electronic circuitry that is arranged to implement a lookup table that maps different negative counter values i to corresponding values of arctanh($1-2^{i-2}$). The positive lookup table 378 may include any suitable type of electronic circuit that is arranged to operate a lookup table that maps different positive counter values i to corresponding values of arctanh($2^{-i}$). Together, the negative lookup table 374 and the positive lookup table 378 may map each of the values for i, which are specified by Equation 10 above, to corresponding values of arctanh($1-2^{i-2}$) or arctanh($2^{-i}$), respectively.

The calculation circuit 352 may include a negative counter 372 and a positive counter 376. The negative counter 372 may include any suitable type of electronic circuitry that is configured to provide the negative lookup table 374 and a series of negative counter values—i.e., the value of a counter i that are less than 0. The positive counter 376 may include any suitable type of electronic circuitry that is configured to provide the negative lookup table 374 and a series of positive counter values—i.e., the values of the counter i that are greater than or equal to 0. The positive counter 376 may begin providing the series of positive counter values i to the positive lookup table 378 after the negative counter 372 has finished providing the series of negative counter values to the positive lookup table 378. Together, the negative counter 372 and the positive counter 376 may provide (to the negative lookup table 374 and the positive lookup table 378, respectively) the values of the set that is specified by Equation 10 above.

For each negative counter value i, the CORDIC module 362 may receive, from the negative lookup table 374, the value of arctanh($1-2^{i-2}$). For each positive counter value i, the CORDIC module 362 may receive, from the negative lookup table 374, the value of arctanh($2^{-i}$). For each received value of arctanh($1-2^{i-2}$) and arctanh($2^{-i}$), the CORDIC module may iteratively evaluate any of Equations 1-12 to calculate the value of $z_i$, cosh($z_i$), and sinh($z_i$). At the end of each iteration, the CORDIC module 362 may store the calculated values of $z_i$, cosh($z_i$), and sinh($z_i$) into the memory 364 for use in the next iteration (e.g., see Equations 1-6). After the last iteration is completed, the driving logic 368 may enable the register 380, thereby causing the value of cosh($z_i$) that is calculated at the last iteration to be stored in the register 380. After the last iteration is completed, the driving logic 368 may enable the register 382, thereby causing the value of sinh($z_i$) that is calculated at the last iteration to be stored in the register 382.

The value of cosh($z_i$), which is calculated at the last iteration may be a close approximation of cosh(Z), and the value of sinh($z_i$), which is calculated at the last iteration may be a close approximation sinh(Z). It will be recalled that the value of Z is received by the calculation circuit 352 (as input), from the multiplexer 312, and it may be the result of any of the affine functions 202A, 204A, and 206A, which are discussed above with respect to FIG. 2B. After the values of cosh($z_i$) and sinh($z_i$) are stored in registers 380 and 382, respectively, the driving logic 368 may set the signal 353 to a first value (e.g. a logic-high value). As noted above, after the value of the signal 353 is set to the first value, the divider 354 may retrieve the values that are stored in the registers 380 and 382, respectively, and calculate the value of tanh(Z). Furthermore, after the values stored in registers 380 and 382 are retrieved, the driving logic 368 may set the signal 353 to a second value (e.g., a logic-low value).

Figure 4:
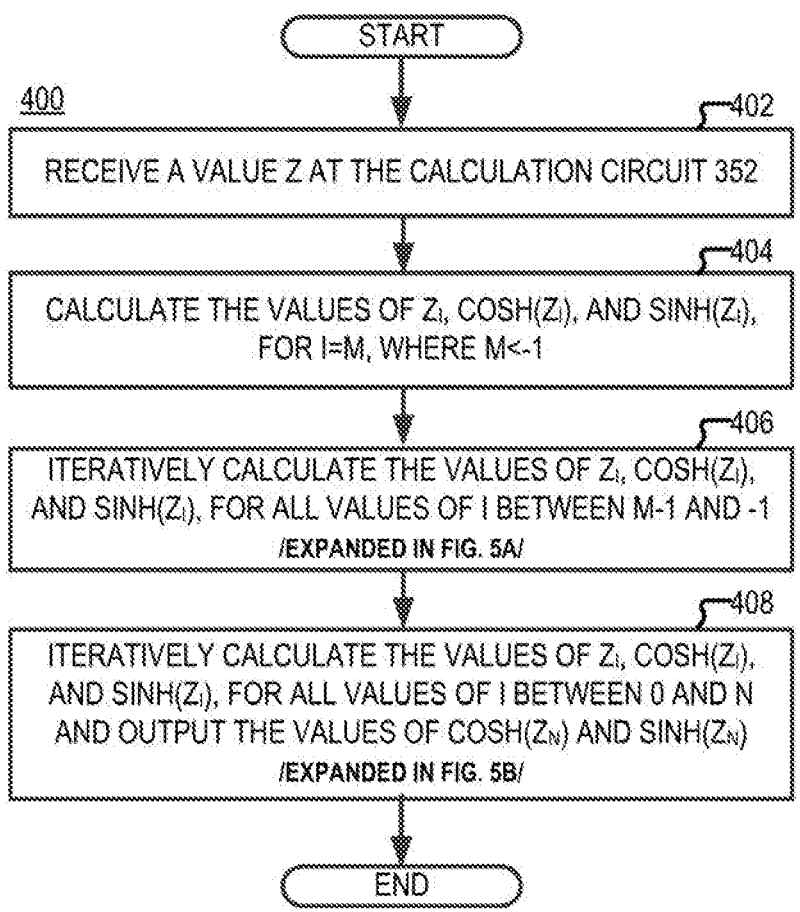
FIG. 4 is a flowchart of an example of a process, according to aspects of the disclosure.

FIG. 4 is a flowchart of an example of a process 400 that is performed by the calculation circuit 352.

At step 402, the calculation circuit 352 receives a value Z from the multiplexer 312. As noted above, the value Z may be calculated by evaluating any of the affine functions 202A, 204A, and 206A, which are discussed above with respect to FIG. 2. At step 404, the calculation circuit 352 calculates the values of $z_m$, cosh($z_m$), and sinh($z_m$), and stores the values of $z_m$, cosh($z_m$), and sinh($z_m$) in the memory 364. The value of $z_m$ may be equal to the value of Z (e.g., see Equation 11), and the values of cosh($z_m$) and sinh($z_m$) may be calculated in accordance with any of Equations 1-12, which are discussed above with respect to FIG. 3C. As noted above, m is the lower bound of the range of the counter i, which is defined by Equation 10. At step 406, the calculation circuit 352 iteratively calculates the values of $z_i$, cosh($z_i$), and sinh($z_i$) for $M+1 \leq i \leq -1$. The values of $z_i$, cosh($z_i$), and sinh($z_i$) are calculated in accordance with Equations 4-6, which are discussed above with respect to FIG. 3C. The manner in which step 406 is executed is discussed in further detail with respect to FIG. 5A. At step 408, the calculation circuit 352 iteratively calculates the values $z_i$, cosh($z_i$), and sinh($z_i$) for $0 \leq i \leq n$, after which the values of cosh($z_n$), and sinh($z_n$) are output to the divider 354. The values of $z_i$, cosh($z_i$), and sinh($z_i$) are calculated in accordance with Equations 1-3, which are discussed above with respect to FIG. 3C. As noted above, n may be the upper bound of the range for the counter i, which is specified by Equation 10. The manner in which step 408 is executed is discussed in further detail with respect to FIG. 5B.

Figure 5A:
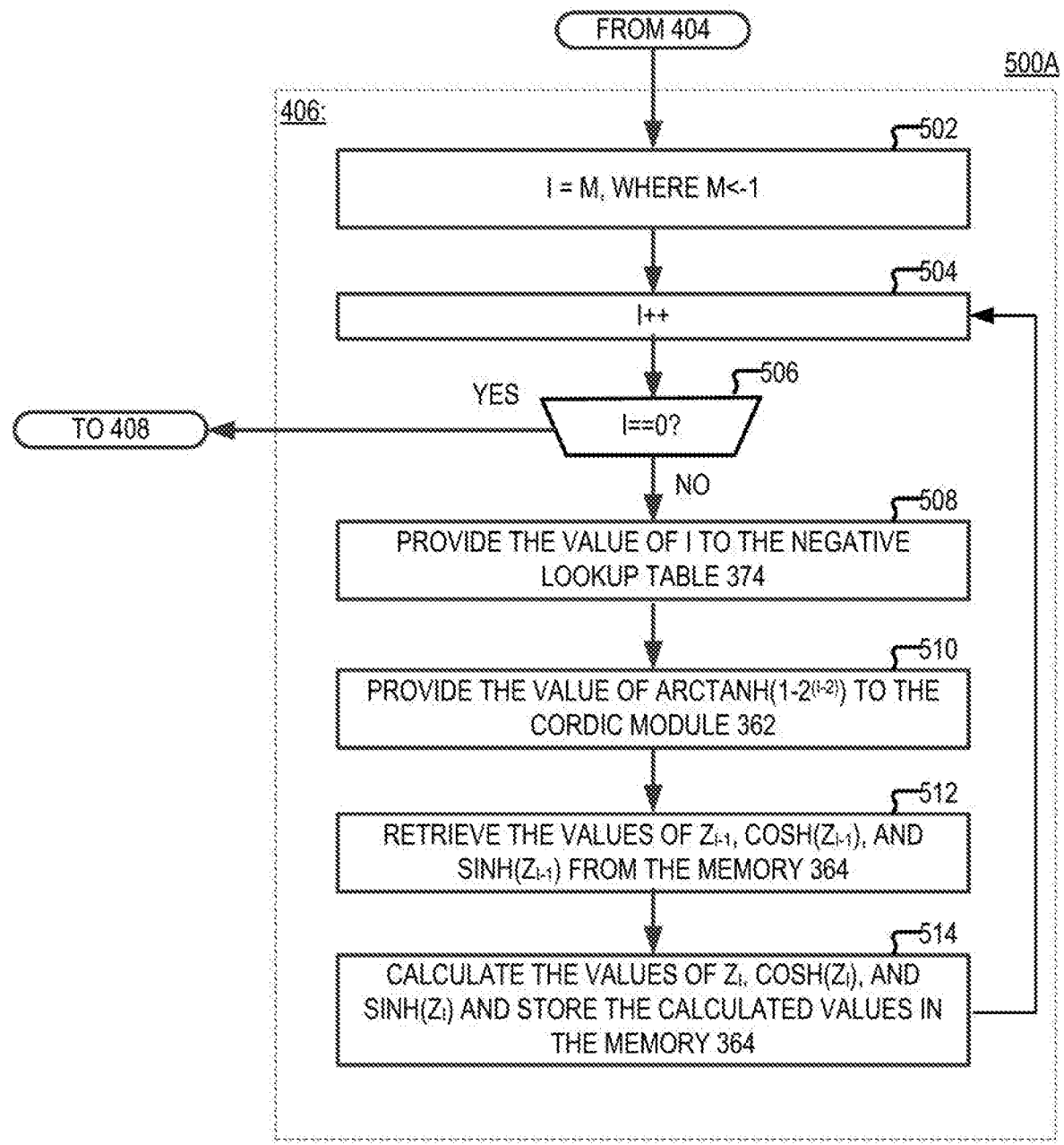
FIG. 5A is a flowchart of an example of a process, according to aspects of the disclosure.

FIG. 5A is a flowchart of an example of a process 500A for calculating cosh($z_i$), and sinh($z_i$) for $M+1 \leq i \leq -1$, as specified by step 406 of the process 400. At step 502, the negative counter 372 sets the value of counter i to −M. As noted above −M is the lower bound of the range for counter i. At step 504, the negative counter 372 increments the value of counter i by one. At step 506, the driving logic 368 determines if the value of counter i is equal to 0. If the value of counter i is equal to 0, the process 500A returns to step 408. Otherwise, if the value of counter i is less than 0, the process proceeds to step 508. At step 508, the negative counter 372 provides the value of counter i to the negative lookup table 374. At step 510, the negative lookup table 374 provides the value of arctan($1-2^{(i-2)}$) to the CORDIC module 362. At step 512, the CORDIC module 362 retrieves the values of $z_{i-1}$, cosh($z_{i-1}$), and sinh($z_{i-1}$) from the memory 364. At step 514, the CORDIC module 362 calculates the values of $z_i$, cosh($z_i$), and sinh($z_i$) based on the value of arctan($1-2^{(i-2)}$) and the values of $z_{i-1}$, cosh($z_{i-1}$), and sinh($z_{i-1}$). In some implementations, the values of $z_i$, cosh($z_i$), and sinh($z_i$) may be calculated based on Equations 4-6, which are discussed above with respect to FIG. 3C. After the values of $z_i$, cosh($z_i$), and sinh($z_i$) are calculated, they are stored in the memory 364.

Figure 5B:
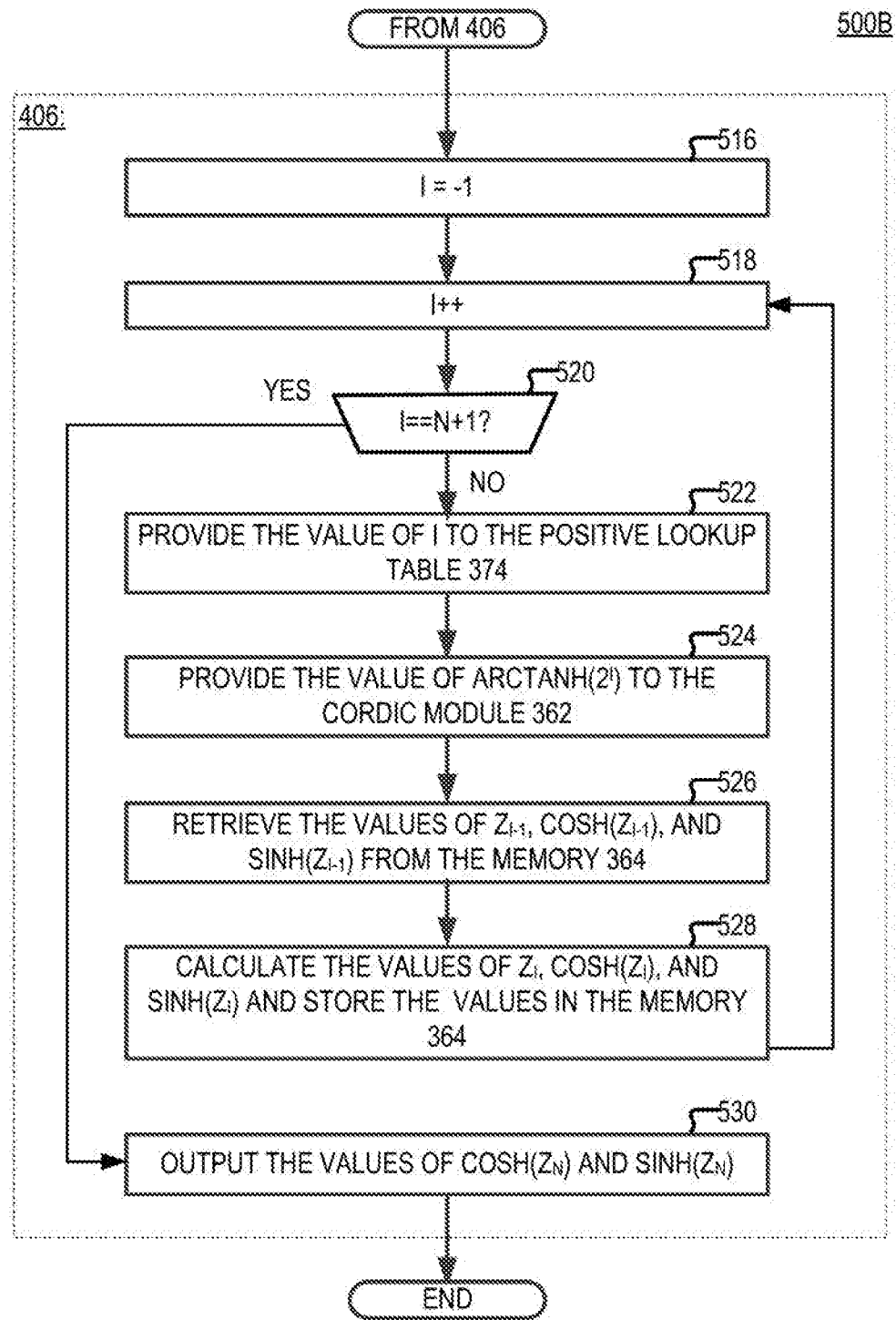
FIG. 5B is a flowchart of an example of a process, according to aspects of the disclosure.

FIG. 5B is a flowchart of an example of a process 500B for calculating cosh($z_i$), and sinh($z_i$) for $0 \leq i \leq N$, as specified by step 408 of the process 400A. At step 516, the positive counter 376 sets the value of counter i to −1. At step 518, the positive counter 376 increments the value of counter i by one. At step 520, the driving logic 368 determines if the value of counter i is less than (N+1). If the value of counter i is less than (N+1), the process 500B proceeds to step 522. Otherwise, if the value of counter i is greater than (N+1), the process 500B proceeds to step 530. At step 522, the positive counter 376 provides the value of counter i to the positive lookup table 378. At step 524, the positive lookup table 378 provides the value of arctan($1-2^{(i)}$) to the CORDIC module 362. At step 526, the CORDIC module 362 retrieves the values of $z_{i-1}$, cosh($z_{i-1}$), and sinh($z_{i-1}$) from the memory 364. At step 528, the CORDIC module 362 calculates the values of $z_i$, cosh($z_i$), and sinh($z_i$) based on the value of arctan($1-2^{(i)}$) and the values of $z_{i-1}$, cosh($z_{i-1}$), and sinh($z_{i-1}$). In some implementations, the values of $z_i$, cosh($z_i$), and sinh($z_i$) may be calculated based on Equations 1-3, which are discussed above with respect to FIG. 3C. After the values of $z_i$, cosh($z_i$), and sinh($z_i$) are calculated, they are stored in the memory 364. At step 530, the values of cosh($z_n$) and sinh($z_n$) are stored in the registers 380 and 382 (e.g., by the driving logic 368), and the signal 353 is set to a first value (e.g. a logic-high value).

Figure 6A:
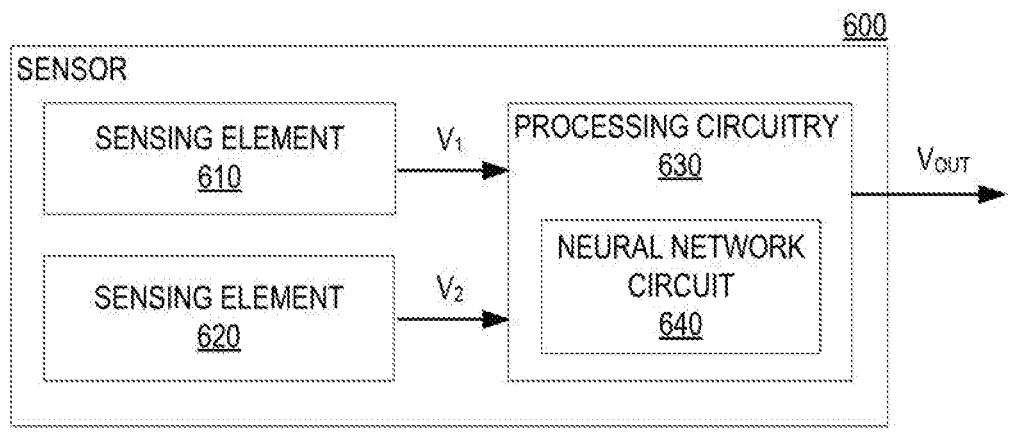
FIG. 6A is a diagram of an example of a sensor, according to aspects of the disclosure.

FIG. 6A is a diagram of an example of a sensor 600, according to aspects of the disclosure. The sensor 600 may include a magnetic field sensor (e.g., an angle sensor, a current sensor, etc.), a pressure sensor, a chemical sensor, an optical sensor, a chemical sensor, and/or any other suitable type of sensor. The sensor 600 may include a sensing element 610 and a sensing element 620. The sensing element 610 may be arranged to generate a signal $V_1$ and the sensing element 620 may be arranged to generate a signal $V_2$. The sensing element 610 may include any suitable type of sensing element, such as a magnetic-field-sensing element, a pressure-sensing element, a light-sensing element (e.g., a photodiode), and/or any other suitable type of sensing element. The sensing element 620 may include any suitable type of sensing element, such as a temperature-sensing element, a stress-sensing element, a humidity-sensing element.

The sensor 600 may further include a processing circuitry 630 that includes a neural network circuit 640. The neural network circuit 640 may be arranged to adjust the gain and/or offset of the signal $V_1$ based on the signal $V_2$. More particularly, the sensing element 620 may be arranged to measure a condition of the environment of the sensing element 610 that affects the sensitivity of the sensing element 610, such as temperature, stress, humidity, etc. And the neural network circuit 640 may adjust the gain and/or offset of the signal $V_1$ (based on the signal $V_2$) to correct for variations in the sensitivity of the sensing element 610 that are caused by changes in the environmental condition. For example, in some implementations, the sensing element 610 may be a magnetic-field-sensing element (e.g., a Hall element, a giant magnetoresistance (GMR) element, a tunnel magnetoresistance (TMR) element, an anisotropic magnetoresistance (AMR) element, a magnetic tunnel junction (MTJ) element, etc.), and the sensing element 620 may be a temperature-sensing element (e.g., a thermistor), etc. In such implementations, the neural network circuit 640 may adjust the gain and/or offset of the signal $V_1$ (which is generated by the sensing element 610) to compensate for variations in the sensitivity of the sensing element 610 that occur in response to changes in the temperature of the sensing element 610.

According to aspects of the disclosure, the sensing element 610 may include one or more transducers (e.g., one or more Hall plates, one or more GMR elements, etc). For example, in some implementations, the sensing element 610 may include a bridge circuit (e.g., a half-bridge or full-bridge circuit). Although FIG. 6A depicts the sensing element 610 as being directly connected to the processing circuitry 630, it will be understood that, in some implementations, there may be other circuitry interposed between the processing circuitry 630 and the sensing element 610. By way of example, such circuitry may include one or more of an amplifier, a modulator circuit, a filter circuit, etc. The signal $V_1$ may include any suitable type of signal that is generated at least in part by the sensing element 610. For example, the signal $V_1$ may be one that is generated directly by the sensing element 610. As another example, the signal $V_1$ may be a signal generated by other circuitry that is interposed between the sensing element 610 and the processing circuitry 630, based on a signal provided by the sensing element 610.

According to aspects of the disclosure, the sensing element 620 may include one or more transducers (e.g., one or more temperature sensors, etc.) Additionally or alternatively, in some implementations, the sensing element 620 may include a bridge circuit (e.g., a half-bridge or a full-bridge circuit, etc.). Although FIG. 1B depicts the sensing element 620 as being directly connected to the processing circuitry 630, it will be understood that, in some implementations, there may be other circuitry interposed between the processing circuitry 630 and the sensing element 620. By way of example, such circuitry may include one or more of an amplifier, a modulator circuit, a filter circuit, etc. The signal $V_2$ may include any suitable type of signal that is generated at least in part by the sensing element 620. For example, the signal $V_2$ may be one that is generated directly by the sensing element 620. As another example, the signal $V_2$ may be a signal generated by other circuitry that is interposed between the sensing element 620 and the processing circuitry 630, based on a signal provided by the sensing element 620.

Figure 6B:
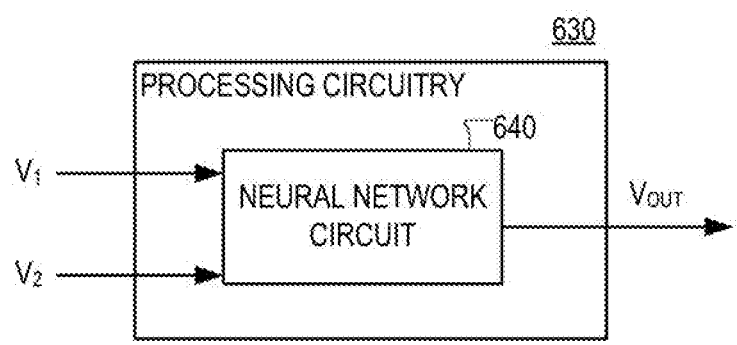
FIG. 6B is a diagram illustrating the operation of a neural network circuit that is part of the sensor of FIG. 6A, according to aspects of the disclosure.

FIG. 6B shows the operation of the neural network circuit 640 in further detail. The neural network circuit 640 may receive the signals $V_1$ and $V_2$ as inputs, and generate an adjusted signal $V_{out}$ as output. In some respects, the relationship between the signal $V_1$ and the signal $V_2$ may be described by Equation 13 below:

$$V_{out}=F*V_1+O \qquad \text{(Eq. 13)},$$

where F is a factor by which the gain of the signal $V_1$ is adjusted by the neural network circuit 640 and O is an offset by which the signal $V_1$ is adjusted by the neural network circuit 640. Unlike the neural network circuit 140, which outputs an adjustment coefficient C that is subsequently used to generate a gain-adjusted signal, the neural network circuit 640 outputs an adjusted signal $V_{out}$ directly. According to the present example, the signal $V_{out}$ is output directly from the sensor 600. However, it will be understood that alternative implementations are possible in which further processing is performed on the signal $V_{out}$ before the signal $V_{out}$ is output from the sensor 600. As can be readily appreciated, the coefficients F and O are not determined explicitly by the neural network circuit 640. In this regard it will be understood, that Equation 13 merely describes the relationship between the input and output of the neural network circuit 640, rather than specific calculations that are performed by the neural network circuit 640. According to the example of FIG. 6B, the neural network circuit 640 adjusts both the gain and offset of the signal $V_1$, however, alternative implementations are possible in which the neural network circuit adjusts only the gain of the signal $V_1$. According to the example of FIG. 6B, the neural network circuit 640 adjusts both the gain and offset of the signal $V_1$, however, alternative implementations are possible in which the neural network circuit adjusts only the offset of the signal $V_1$.

Stated succinctly, the sensing element 610 may be arranged generate the signal $V_1$, which is indicative of the level of a specific stimulus, such as magnetic field density, magnetic field direction, light intensity, light color, etc. The sensing element 620 may be arranged to generate the signal $V_2$ that is indicative of an environmental condition that affects the sensitivity of the sensing element 610, such as temperature, humidity, stress, and/or any other condition. The neural network circuit 640 may be arranged to adjust the gain and/or offset of the signal $V_1$ to compensate (or correct) for changes in the sensitivity of the sensing element 610 that are caused by the environmental condition. As noted above, the neural network circuit 640 may, at least in part, adjust the gain and/or offset of the signal $V_1$ to produce an adjusted signal $V_{out}$. The neural network circuit 640, in other words, may dynamically calibrate the signal output from the sensing element 610 based on cotemporaneous measurements of an environmental condition (obtained from the sensing element 620) in order to bring the signal in conformance with a given signal processing framework.

Figure 7A:
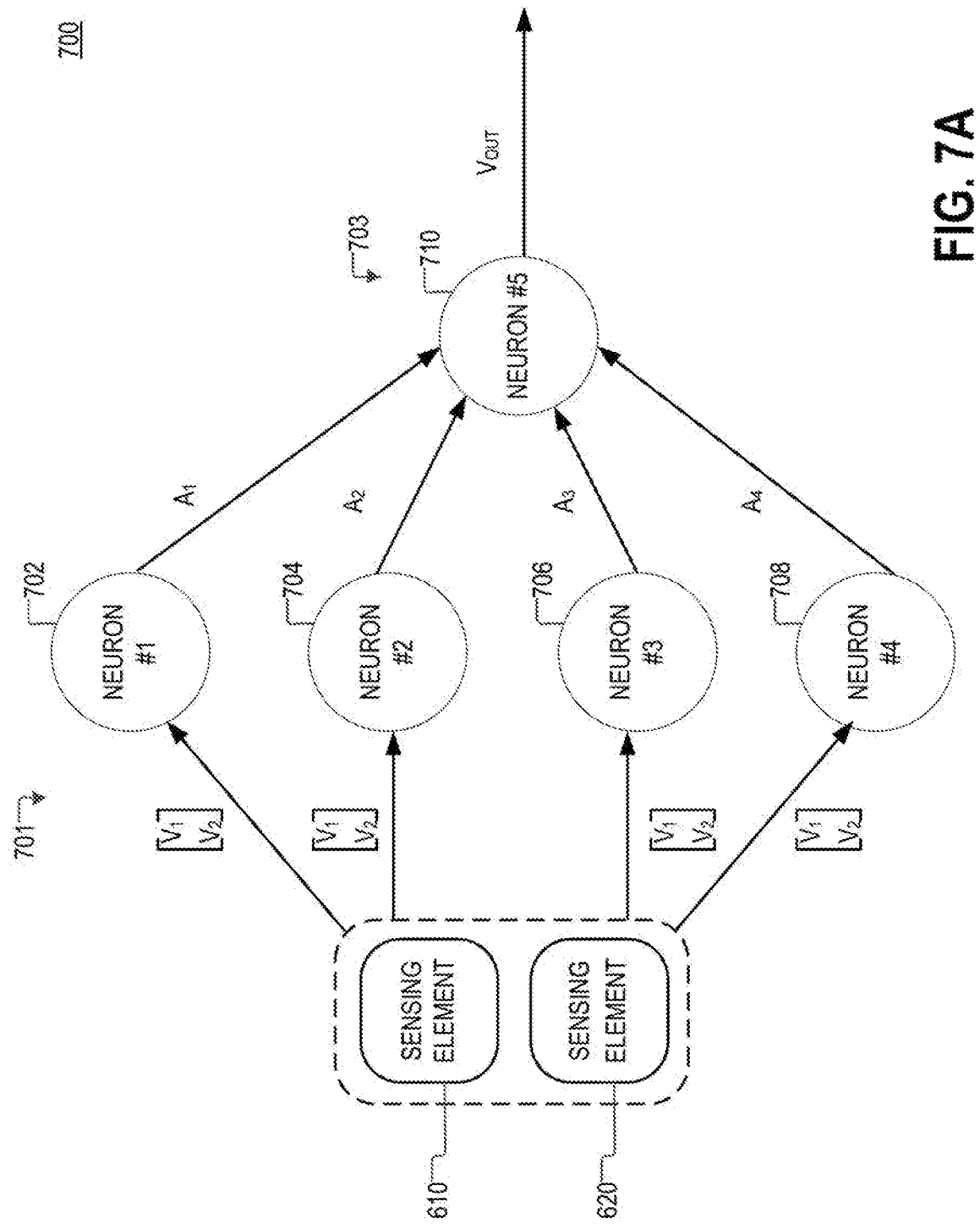
FIG. 7A is a diagram of an example of a neural network that is implemented by the neural network circuit of FIG. 6B, according to aspects of the disclosure.
Figure 7B:
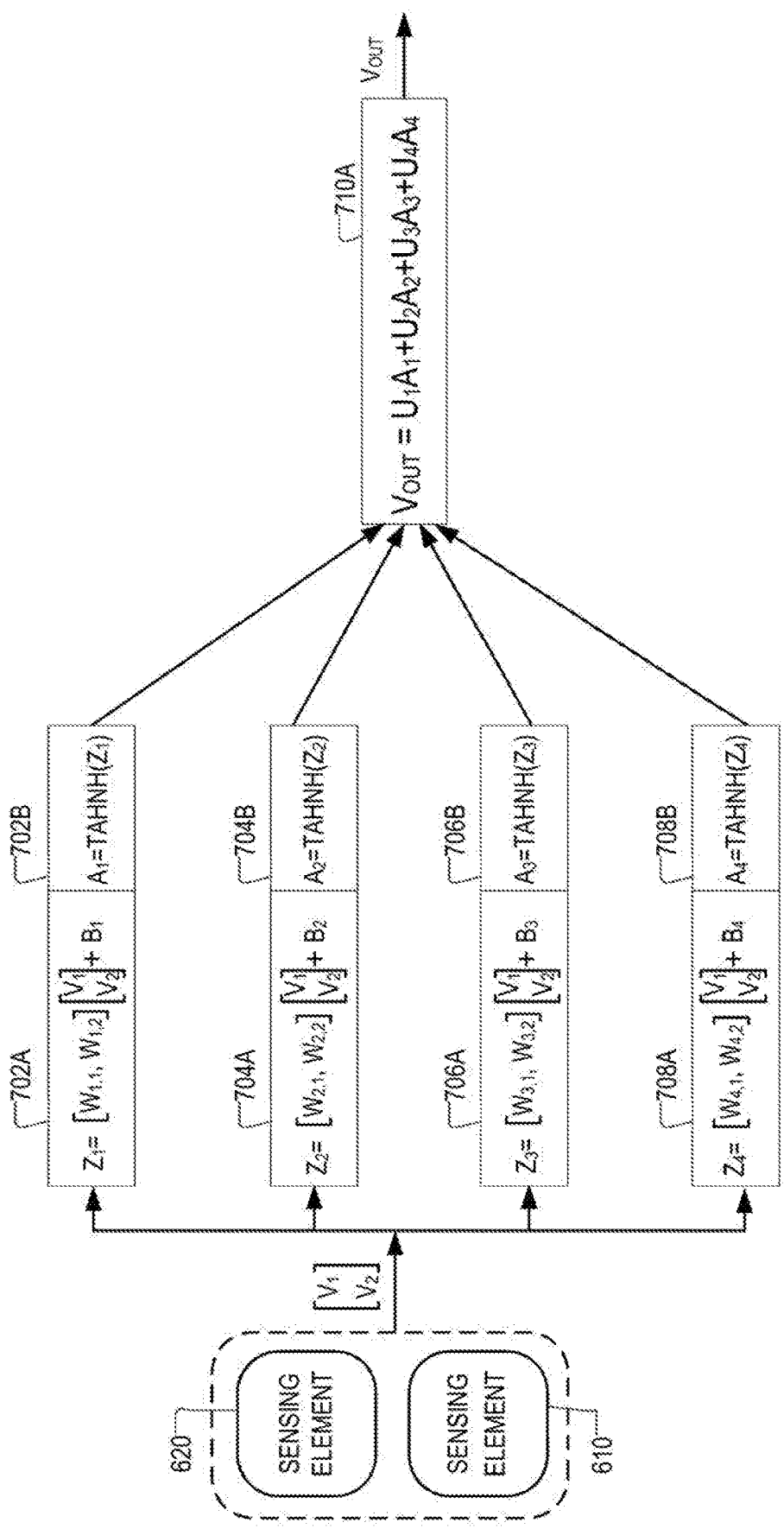
FIG. 7B is a diagram showing the neural network of FIG. 7A in further detail, according to aspects of the disclosure.

FIGS. 7A-B show a neural network 700, which is implemented by the neural network circuit 640, in further detail. As illustrated, the neural network 700 may receive, as input, a vector $[V_1, V_2]$ and output a value $V_{out}$ that is generated based on the vector $[V_1, V_2]$. The value $V_1$ of the input vector may include a digitized sample of the signal $V_1$. The value $V_2$ of the input vector may include a digitized sample of the signal $V_2$. As used throughout the disclosure, the terms "value $V_1$" and "signal $V_1$" are used interchangeably. Similarly, as used throughout the disclosure, the terms "value $V_2$" and "signal $V_2$" are also used interchangeably.

As illustrated, the neural network 700 may include a hidden layer 701 and an output layer 703. The hidden layer 701 may include neurons 702, 704, 706, and 708, and the output layer 703 may include a neuron 710. The neuron 702 may include an affine function 702A and an activation function 702B. The neuron 704 may include an affine function 704A and an activation function 704B. The neuron 706 may include an affine function 706A and an activation function 706B. The neuron 708 may include an affine function 708A and an activation function 708B. And the 710 may include an activation function 710A. Although the hidden layer 701 includes four neurons in the example of FIGS. 7A-B, it will be understood that the present disclosure is not limited to any specific number of hidden neurons being present in the hidden layer 701.

The affine function 702A may generate a value $\Sigma_t$ by multiplying a weight vector $[W_{1,1}, W_{1,2}]$ by the vector $[V_1, V_2]$ and adding a bias coefficient $B_1$ to the resulting product. The activation function 702B may generate an activation value $A_1$ by calculating the hyperbolic tangent of the value $Z_1$. The affine function 704A may generate a value $Z_2$ by multiplying a weight vector $[W_{2,1}, W_{2,2}]$ by the vector $[V_1$, $V_2$] and adding a bias coefficient $B_2$ to the resulting product. The activation function 704B may generate an activation value $A_2$ by calculating the hyperbolic tangent of the value $Z_2$. The affine function 706A may generate a value $Z_3$ by multiplying a weight vector [$W_{3,1}$, $W_{3,2}$] by the vector [$V_1$, $V_2$] and adding a bias coefficient $B_3$ to the resulting product. The activation function 706B may generate an activation value $A_3$ by calculating the hyperbolic tangent of the value $Z_3$. The affine function 708A may generate a value $Z_4$ by multiplying a weight vector [$W_{4,1}$, $W_{4,2}$] by the vector [$V_1$, $V_2$] and adding a bias coefficient $B_4$ to the resulting product. The activation function 708B may generate an activation value $A_4$ by calculating the hyperbolic tangent of the value $Z_4$. The activation function 710A may calculate the value $V_{out}$ by multiplying the activation values $A_1$, $A_2$, $A_3$, $A_4$ by respective weights $U_1$, $U_2$, $U_3$, and $U_4$ and summing up the resulting products. Although in the example of FIG. 7B the activation function 710A is defined as $V_{OUT}=U_1A_1+U_2A_2+U_3A_3+U_4A_4$, it will be understood that in some implementations, the activation function 710A can be generalized as $V_{OUT}=\Sigma_i U_i^* A_i$.

According to the present example, the weight vectors [$W_{1,1}$, $W_{1,2}$], [$W_{2,1}$, $W_{2,2}$], [$W_{3,1}$, $W_{3,2}$], and [$W_{4,1}$, $W_{4,2}$] are different from one another, however it will be understood that the present disclosure is not limited thereto. According to the present example, the bias coefficients $B_1$, $B_2$, $B_3$, $B_4$ are different from one another, however it will be understood that the present disclosure is not limited thereto. According to the present example, the weights $U_1$, $U_2$, $U_3$, and $U_4$ are different from one another, however it will be understood that the present disclosure is not limited thereto. According to the present example, each of the weights $W_{1,1}$, $W_{1,2}$, $W_{2,1}$, $W_{2,2}$, $W_{3,1}$, $W_{3,2}$, $W_{4,1}$, $W_{4,2}$, each of the weights $U_1$, $U_2$, $U_3$, $U_4$, and each of the bias coefficients $B_1$, $B_2$, $B_3$, and $B_4$ is a real number. According to the present example, the neural network 700 is trained by using a supervised learning algorithm. However, it will be understood that the present disclosure is not limited to any specific method for training the neural network 700. An example of a process for training the neural network 700 is discussed further below with respect to FIG. 10.

Although in the example of FIG. 7, the neural network 700 is configured to adjust the signal $V_1$ based on one other signal (i.e., $V_2$), it will be understood that alternative implementations are possible in which the neural network 700 is configured to adjust the signal $V_1$ based on more than one other signal. In such implementations, the affine function of each of the hidden nodes may be equal to the sum of the weighted value of signal $V_1$ and a weighted value of each of the other signals that are used to adjust the signal $V_1$ (e.g., $Z=W_1^*V_1+W_2^*V_2+W_2'V_2'+W_2''V_2''+ \ldots +B$, where $W_2$, $W_2'$, and $W_2''$ are different weights, $V_2$, $V_2'$, $V_2''$ are signals used to adjust the signal $V_1$, and B is a bias value). As noted above, any of the weights may be equal to 1 or have a value that is different from 1. As noted above, B may be equal to zero or have a value that is different from zero. The present disclosure is not limited to any specific number of other signals being used to adjust the signal $V_1$.

Figure 8A:
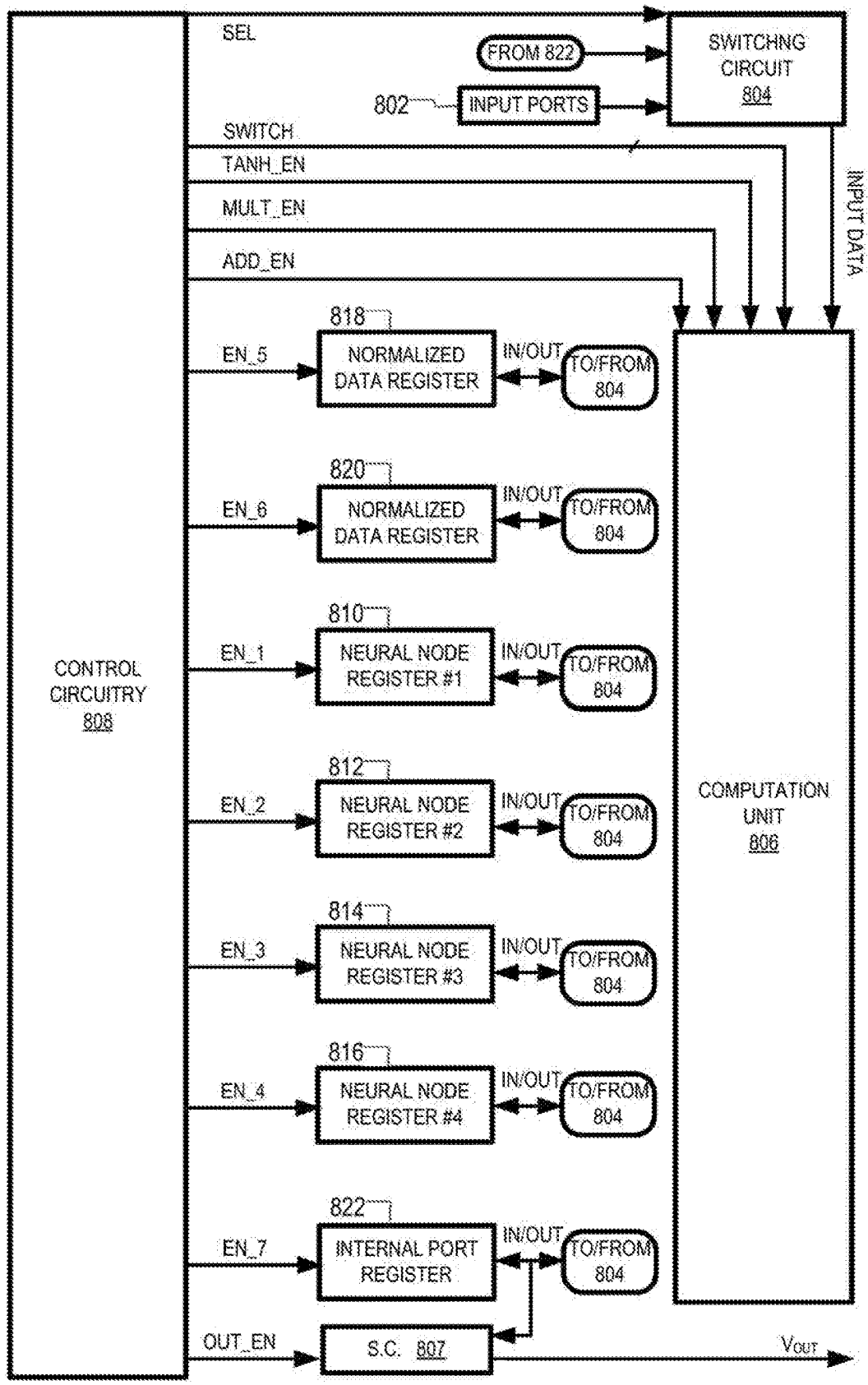
FIG. 8A is a diagram illustrating the neural network circuit of FIG. 6B, according to aspects of the disclosure.

FIG. 8A is a diagram illustrating an example of one possible implementation of the neural network circuit 640, according to aspects of the disclosure. As illustrated, the neural network circuit 640 may include input ports 802, a switching circuit 804, a computation unit 806, a control circuitry 808, neural node registers 810-816, normalized data registers 818-820, and an internal port register 822.

The input ports 802 may include ports for receiving data. The received data may include data that is provided as input to the neural network 700 and/or data that is generated internally by the neural network circuit 640 over the course of evaluating the neural network 700. The data that is received at the input ports 802 may include the vector [$V_1$, $V_2$]. Additionally or alternatively, in some implementations, the data that is received at the input ports 802 may include any of the weight vectors [$W_{1,1}$, $W_{1,2}$], [$W_{2,1}$, $W_{2,2}$], [$W_{3,1}$, $W_{3,2}$], and [$W_{4,1}$, $W_{4,2}$], which are discussed above with respect to FIG. 7B. Additionally or alternatively, in some implementations, the data that is received at the input ports 802 may include any of the weights U1, U2, U3, and U4, which are discussed above with respect to FIG. 7B. Additionally or alternatively, in some implementations the data that is received at the input ports 802 may include any of the bias coefficients B1, B2, B3, and B4, which are discussed above with respect to FIG. 7B. Additionally or alternatively, in some implementations the data that is received at the input ports 802 may include any of the coefficients K1 and K2, which are discussed further below with respect to FIG. 9B. Although not shown in FIG. 8A, each of the input ports may be associated with a respective register where the data that is being input via that port is stored prior to that data being routed to the computation unit 806 (by the switching circuit 804).

The switching circuit 804 may include one or more multiplexers for routing data that is received on any of the input ports 802 (and/or the value that is stored in the internal port register 822) to the computation unit 806. In operation, the switching circuit 804 may be arranged to receive a selection signal SEL from the control circuitry 808 and route one or more of the values that are received at the input ports 802 to the computation unit 806 (and/or the value that is stored in the internal port register 822) based on the selection signal SEL. For example, if the selection signal SEL has a first value, the switching circuit 804 may provide a first subset of the values received at the input ports 802 to the computation unit 806, and if the selection signal SEL has a second value, the switching circuit 804 may provide a second subset of the values received at the input ports 802 to the computation unit 806.

Figure 8B:
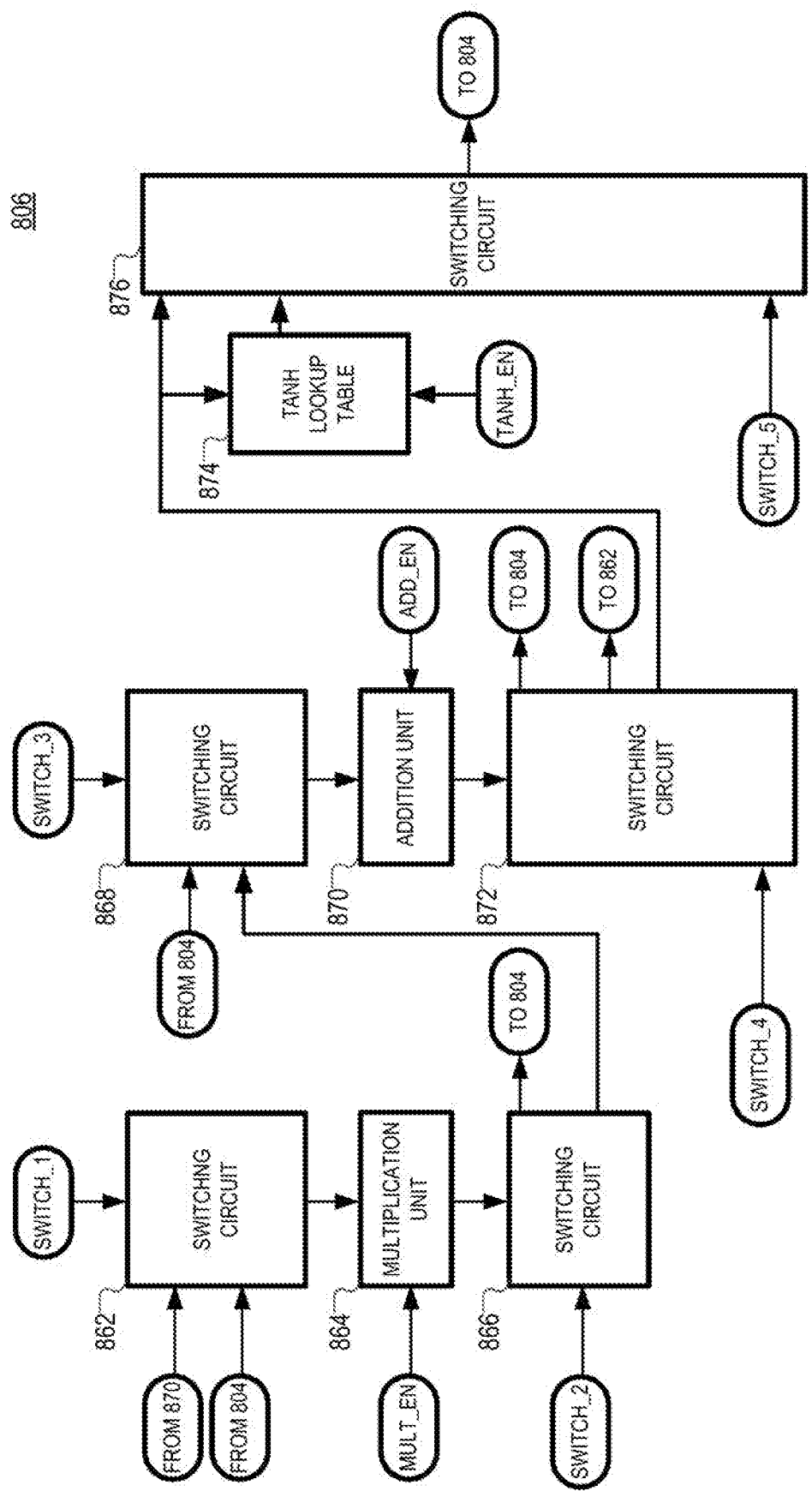
FIG. 8B is a diagram of an example of an evaluator that is part of the neural network circuit of FIG. 3A, according to aspects of the disclosure.

The computation unit 806 may include electronic circuitry that is arranged to perform the calculations necessary for evaluating the neural network 700 (shown in FIG. 7B). The computation unit 806 may be arranged to receive, from the control circuitry 808, a SWITCH signal, a MULT_EN signal, an ADD_EN signal, and an OUT_EN signal. The SWITCH signal may include a SWITCH_1 signal, a SWITCH_2 signal, a SWITCH_3 signal, a SWITCH_4 signal, and a SWITCH_5 signal. As illustrated in FIG. 8B, each of the SWITCH_1 signal, the SWITCH_2 signal, the SWITCH_3 signal, the SWITCH_4 signal, and the SWITCH_5 signal may be arranged to control a different switching circuit that is part of the computation unit 806. The ADD_EN signal may be arranged to enable an addition unit 870 (shown in FIG. 8B) that is part of the computation unit 806. And the MULT_EN signal may be arranged to enable a multiplication unit that is part of the multiplication unit 864.

In operation, the computation unit 806 may evaluate the neural network 700 (shown in FIGS. 7A-B) by performing a series of calculations and storing the final result in the calculations in the neural node register 810. The final result of the calculations may be the value $V_{out}$, which is discussed above with respect to FIGS. 6A-7B. After the value $V_{out}$ is stored in the neural node register 810, the control circuitry 808 may cause a switching circuit 807 (e.g., a multiplexer)

to output the value $V_{out}$ by setting the OUT_EN signal to a first value (e.g., a logic-high value).

The control circuitry 808 may include electronic circuitry that is arranged to implement a finite state machine for controlling the operation of the computation unit 806 by providing a series of control vectors to the switching circuit 804, the computation unit 806, and the registers 810-812. Each control vector in the series may correspond to a different state of the finite state machine. Each control vector may include a different set of values for the signals SEL, SWITCH_1, SWITCH_2, SWITCH_3, SWITCH_4, SWITCH_5, and MULT_EN, ADD_EN, MULT_EN, OUT_EN, EN_1, EN_2, EN_3, EN_4, EN_5, EN_6, and EN_7. In some implementations, the control circuitry 808 may cause the computation unit 806 to perform any of the steps discussed below with respect to FIGS. 9A-9B by providing corresponding control vectors to the computation unit 806.

The neural node register 810 may include an input port and an output port that are coupled to the switching circuitry 804, and it may be configured to receive an enable signal EN_1 from the control circuitry 808. In operation, the neural node register 810 may output the value that is stored in the neural node register 810 via the output port of the neural node register 810. When the enable signal EN_1 is set to a first value (e.g., a logic high value), the neural node register 810 may store the value that is applied at the input port of the neural node register 810.

The neural node register 812 may include an input port and an output port that are coupled to the switching circuitry 804, and it may be configured to receive an enable signal EN_2 from the control circuitry 808. In operation, the neural node register 812 may output the value that is stored in the neural node register 812 via the output port of the neural node register 812. When the enable signal EN_2 is set to a first value (e.g., a logic high value), the neural node register 812 may store the value that is applied at an input port 842 of the neural node register 812.

The neural node register 814 may include an input port and an output port that are coupled to the switching circuitry 804, and it may be configured to receive an enable signal EN_3 from the control circuitry 808. In operation, the neural node register 814 may output the value that is stored in the neural node register 814 via the output port of the neural node register 814. When the enable signal EN_3 is set to a first value (e.g., a logic high value), the neural node register 814 may store the value that is applied at the input port of the neural node register 814.

The neural node register 816 may include an input port and an output port, and it may be configured to receive an enable signal EN_4 from the control circuitry 808. In operation, the neural node register 816 may output the value that is stored in the neural node register 816 via the output port 851. When the enable signal EN_4 is set to a first value (e.g., a logic high value), the neural node register 816 may store the value that is applied at the input port 844 of the neural node register 816.

The normalized data register 818 may include an input port and an output port that are coupled to the switching circuitry 804, and it may be configured to receive an enable signal EN_5 from the control circuitry 808. In operation, the normalized data register 818 may output the value that is stored in the normalized data register 818 via the output port of the normalized data register 818. When the enable signal EN_5 is set to a first value (e.g., a logic high value), the normalized data register 818 may store the value that is applied at the input port of the normalized data register 818.

The normalized data register 820 may include an input port and an output port that are coupled to the switching circuitry 804, and it may be configured to receive an enable signal EN_6 from the control circuitry 808. In operation, the normalized data register 820 may output the value that is stored in the normalized data register 820 via the output port of the normalized data register 820. When the enable signal EN_6 is set to a first value (e.g., a logic high value), the normalized data register 820 may store the value that is applied at the input port of the normalized data register 820.

The internal port register 822 may include an input port and an output port that are coupled to the switching circuitry 804, and it may be configured to receive an enable signal EN_7 from the control circuitry 808. In operation, the internal port register 822 may output the value that is stored in the internal port register 822 via the output port of the internal port register. When the enable signal EN_7 is set to a first value (e.g., a logic high value), the internal port register 822 may store the value that is applied at the input port of the internal port register 822. As illustrated in FIG. 8A, the output port of the internal port register 822 may be also coupled to the switching circuit 804, thus allowing the value stored in the internal port register 822 to be cycled back into the calculations that are being performed by the computation unit 806

FIG. 8B shows the computation unit 806 in further detail. As illustrated, the computation unit 806 may include a multiplication unit 864, an addition unit 870, and a lookup table 874 that are connected to one another via a switching circuit 862, a switching circuit 866, a switching circuit 868, a switching circuit 872, and a switching circuit 876.

The switching circuit 862 may include one or more multiplexers that are configured to route to the input ports of the multiplication unit 864: (i) any value that is output on the output ports of the registers 810-822 (which is received via the switching circuitry 804), (ii) the value that is output from the addition unit 870, and/or (iii) any other values that are output from the switching circuit 804. The multiplication unit 864 may multiply any values that are provided to it by the switching circuit 862 and output the resulting product to the switching circuit 866. The switching circuit 866 may provide the resulting product to the switching circuit 868 and/or the switching circuit 804 for storage in any of the registers 810-822. As illustrated, the values that are provided at the input ports of the multiplication unit 864 are selected by the signal SWITCH_1 and the destination where the output of the multiplication unit 864 is routed is selected by the signal SWITCH_2.

The switching circuit 868 may include one or more multiplexers that are configured to route to the input ports of the addition unit 870: (i) any value that is output from the switching circuit 804 (e.g., any value that is stored in any of the registers 810-822), and (ii) the value that is output from the multiplication unit 864. The addition unit 870 may add any values that are provided to it by the switching circuit 868 and output the resulting sum to the switching circuit 872. The switching circuit 872 may provide the resulting sum to the lookup table 874, the switching circuit 876 and/or the switching circuit 804 for storage in any of the registers 810-822. As illustrated, the values that are provided at the input ports of the addition unit 870 are selected by the signal SWITCH_3 and the destination where the output of the multiplication unit 864 is routed is selected by the signal SWITCH_4.

The lookup table 874 may include a lookup table that maps each of a plurality of input values to the hyperbolic tangent for that value. In operation, the lookup table 874 may receive a value X that is output from the addition unit 870 and output the value for tanh(X'), where X' is equal to X or within a predetermined distance from X. As is discussed further below with respect to FIG. 9, the lookup table 874 may be arranged to calculate the activation functions of neurons 702-708 of the neural network 700 (see FIG. 7B). As is discussed further below, the lookup table 874 may generate the value of the activation function of any of the neurons 702-710 of the neural network 700 in the same clock cycle with the addition unit 870 performing the last calculation for evaluating that node's respective affine function.

The switching circuit 876 may be arranged to receive: (i) the value that is output from the lookup table 874 and (ii) the value that is output from the addition unit 870. The switching circuit 876 may be further arranged to output one of the received values on the input ports 841-847 of registers 810-822 (via the switching circuit 804). The value that is output from the switching circuit 876 is selected by the signal SWITCH_5. If the signal SWITCH_5 has a first value, the value output from the lookup table 874 may be stored in one of the registers 810-816. Otherwise, if the signal SWITCH_5 has a second value (e.g., a logic-low value), the value output from the addition unit may be stored in any of registers 810-822.

Figure 9A:
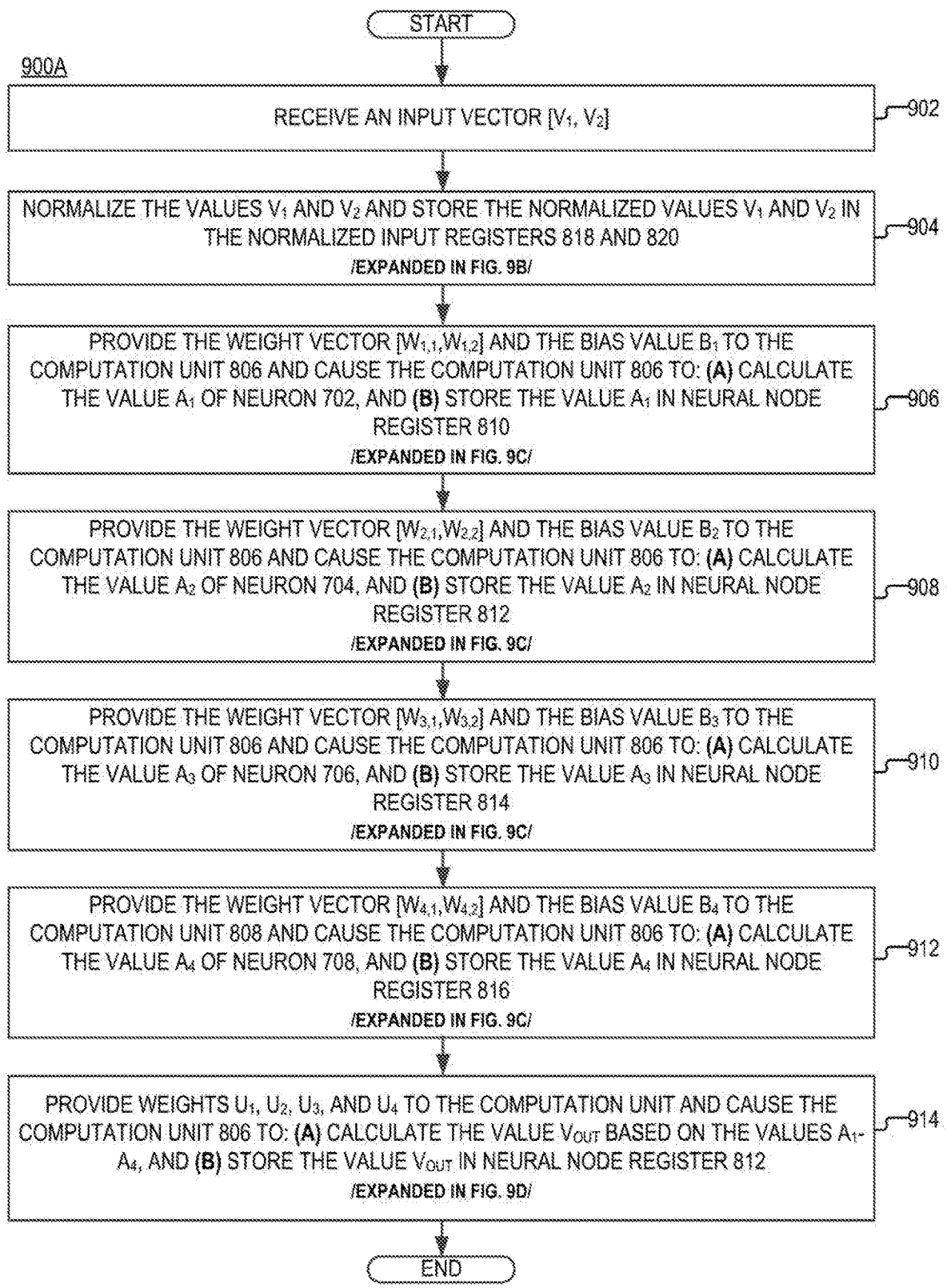
FIG. 9A is a flowchart of an example of a process, according to aspects of the disclosure.

FIG. 9A is a flowchart of an example of a process 900A that is performed by the neural network circuit 640, according to aspects of the disclosure. In some respects, the process 900A is advantageous because it can be executed with high efficiency by the neural network circuit 640. As is discussed further below, the process 900A can be completed in twenty-three (23) clock cycles.

At step 902, the neural network circuit 640 receives the input vector [$V_1$, $V_2$].

At step 904, the control circuitry 808 causes the computation unit 806 to normalize the values $V_1$ and $V_2$ and store the normalized values $V_1$ and $V_2$ in the normalized data registers 818 and 820. The normalized values $V_1$ and $V_2$ form the input vector $V_1$ and $V_2$ are subsequently used by the neural network circuit 640 to evaluate the affine functions 702A-708A, which are discussed above with respect to FIGS. 7A-B. The manner in which step 904 is performed is discussed further below with respect to FIG. 9B. According to the example of FIGS. 8A-9D, step 904 can be executed in two (2) clock cycles.

At step 906, the control circuitry 808 causes the computation unit 806 to evaluate the neuron 702 and store the value $A_1$ (which corresponds to the neuron 702) in the neural node register 810. In particular, the control circuitry 808 causes the switching circuit 804 to provide the weight vector [$W_{1,1}$, $W_{1,2}$] and the bias coefficient $B_1$ to the computation unit 806, while also causing the computation unit 806 to calculate the value $A_1$ based on the weight vector [$W_{1,1}$, $W_{1,2}$] and the bias coefficient $B_1$. The value $A_1$ may be calculated based on the functions 702A and 702B, which are discussed above with respect to FIG. 7B. In some implementations, the value $A_1$ may be calculated in accordance with the process 900C, which is discussed above with respect to FIG. 9C. According to the example of FIGS. 8A-9D, step 904 can be executed in three (3) clock cycles.

At step 908, the control circuitry 808 causes the computation unit 806 to evaluate the neuron 704 and store the value $A_2$ (which corresponds to the neuron 704) in the neural node register 812. In particular, the control circuitry 808 causes the switching circuit 804 to provide the weight vector [$W_{2,1}$, $W_{2,2}$] and the bias coefficient $B_2$ to the computation unit 806, while also causing the computation unit 806 to calculate the value $A_2$ based on the weight vector [$W_{2,1}$, $W_{2,2}$] and the bias coefficient $B_2$. The value $A_2$ may be calculated based on the functions 704A and 704B, which are discussed above with respect to FIG. 7B. In some implementations, the value $A_2$ may be calculated in accordance with the process 900C, which is discussed above with respect to FIG. 9C. According to the example of FIGS. 8A-9D, step 904 can be executed in three (3) clock cycles.

At step 910, the control circuitry 808 causes the computation unit 806 to evaluate the neuron 706 and store the value $A_3$ (which corresponds to the neuron 706) in the neural node register 814. In particular, the control circuitry 808 causes the switching circuit 804 to provide the weight vector [$W_{3,1}$, $W_{3,2}$] and the bias coefficient $B_3$ to the computation unit 806, while also causing the computation unit 806 to calculate the value $A_3$ based on the weight vector [$W_{3,1}$, $W_{3,2}$] and the bias coefficient $B_3$. The value $A_3$ may be calculated based on the functions 706A and 706B, which are discussed above with respect to FIG. 7B. In some implementations, the value $A_3$ may be calculated in accordance with the process 900C, which is discussed above with respect to FIG. 9C. According to the example of FIGS. 8A-9D, step 904 can be executed in three (3) clock cycles.

At step 912, the control circuitry 808 causes the computation unit 806 to evaluate the neuron 708 and store the value $A_4$ (which corresponds to the neuron 708) in the neural node register 816. In particular, the control circuitry 808 causes the switching circuit 804 to provide the weight vector [$W_{4,1}$, $W_{4,2}$] and the bias coefficient $B_4$ to the computation unit 806, while also causing the computation unit 806 to calculate the value $A_4$ based on the weight vector [$W_{4,1}$, $W_{4,2}$] and the bias coefficient $B_4$. The value $A_4$ may be calculated based on the functions 708A and 708B, which are discussed above with respect to FIG. 7B. In some implementations, the value $A_4$ may be calculated in accordance with the process 900C, which is discussed above with respect to FIG. 9C. According to the example of FIGS. 8A-9D, step 904 can be executed in three (3) clock cycles.

At step 914, the control circuitry 808 causes the computation unit 806 to evaluate the neuron 710 and store the value $V_{out}$ in the neural node register 810. After the value $V_{out}$ is stored, the control circuitry 808 causes the switching circuit 807 to output the value $V_{out}$ from the neural network circuit 640. According to the example of FIGS. 8A-9D, step 914 can be executed in five (5) clock cycles.

Figure 9B:
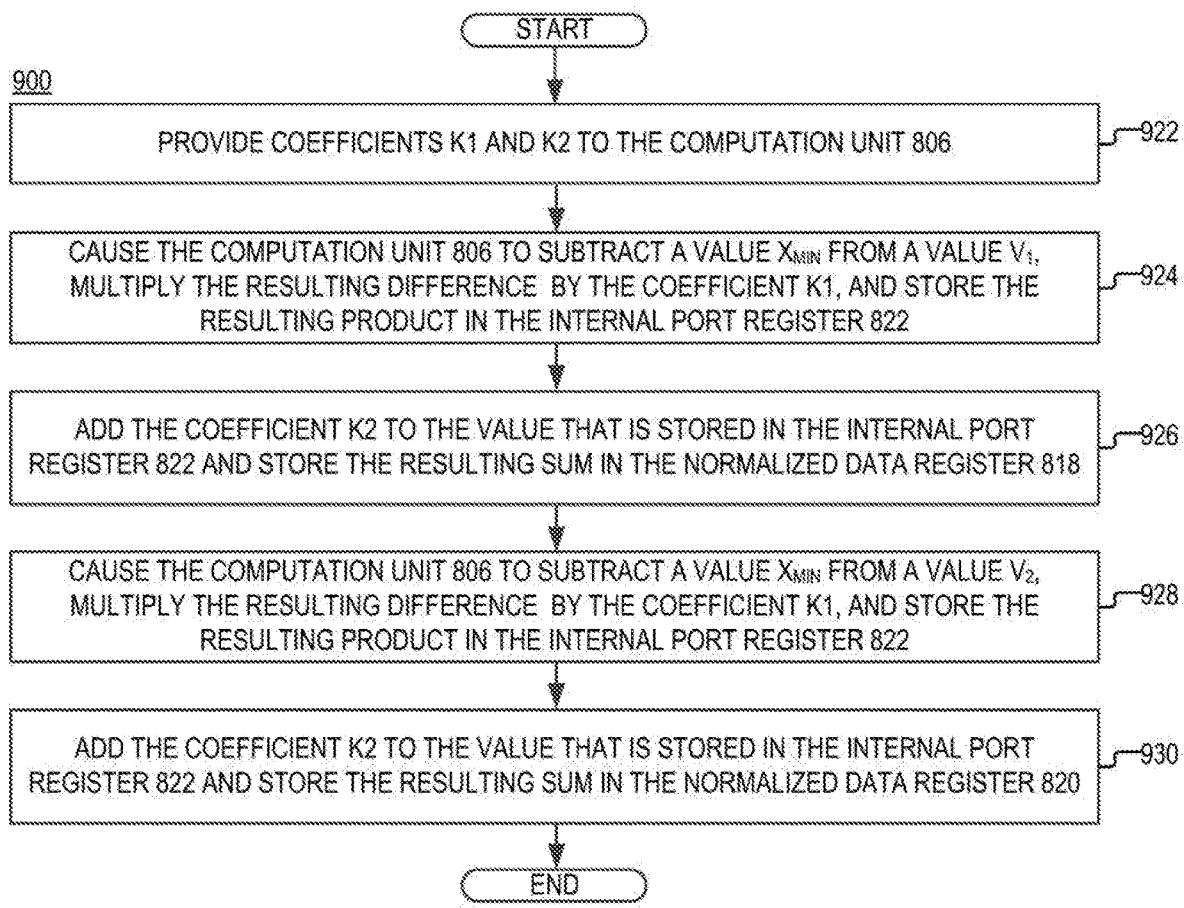
FIG. 9B is a flowchart of an example of a process, according to aspects of the disclosure.

FIG. 9B is a flowchart of an example of a process 900B for normalizing the values $V_1$ and $V_2$, as specified by step 904 of the process 900A. According to the example of FIG. 9B, the normalization is performed in accordance with Equation 14 below:

$$y = \frac{x - x_{min}}{x_{max} - x_{min}}(y_{max} - y_{min}) + y_{min} \qquad (14)$$

where x is the input feature (e.g. one of the raw values $V_1$ and $V_2$ that are obtained from the sensing elements 610 and 620, $x_{min}$ and $x_{max}$ are the minimum and maximum absolute value of x respectively, y is the normalized value of the input feature, $y_{min}$ and $y_{max}$ is the max and min values of the range to which the input feature is being scaled. According to the present example, $y_{min}=-1$ and $y_{max}=1$. According the example of FIG. 9B, the raw values $V_1$ and $V_2$ have the same maxima and minima (e.g., $x_{min}$ and $x_{max}$, etc.). However, it will be understood that alternative implementations are possible when the values $V_1$ and $V_2$ have different maxima and minima (e.g., $x_{min}$ and $x_{max}$, etc.). At step 922, the control circuitry 808 causes the switching circuit 804 to provide coefficients K1 and K2 to the computation unit 806. According to the present example, the coefficients K1 and K2 are defined as follows:

$$K1 = \frac{y_{max} - y_{min}}{x_{max} - x_{min}} \quad (15)$$

$$K2 = y_{min} \quad (16)$$

At step 924, the control circuitry 808 causes the computation unit 806 to subtract the value $x_{min}$ from the value $V_1$. The control circuitry 808 further causes the computation unit 806 to multiply the resulting difference by the coefficient K1, and store the resulting product in the internal port register 822.

At step 926, the control circuitry 808 causes the computation unit 806 to add the coefficient K2 to the value that is stored in the internal port register 822 and store the resulting sum in the normalized data register 818. Under the nomenclature of the present disclosure, the resulting sum that is stored in the normalized data register 818 is the normalized value $V_1$.

At step 928, the control circuitry 808 causes the computation unit 806 to subtract the value $x_{min}$ from the value $V_2$. The control circuitry 808 further causes the computation unit 806 to multiply the resulting difference by the coefficient K1 and store the resulting product in the internal port register 822.

At step 930, the control circuitry 808 causes the computation unit 806 to add the coefficient K2 to the value that is stored in the internal port register 822 and store the resulting sum in the normalized data register 818. Under the nomenclature of the present disclosure, the resulting sum that is stored in the normalized data register 818 is the normalized value $V_2$.

Figure 9C:
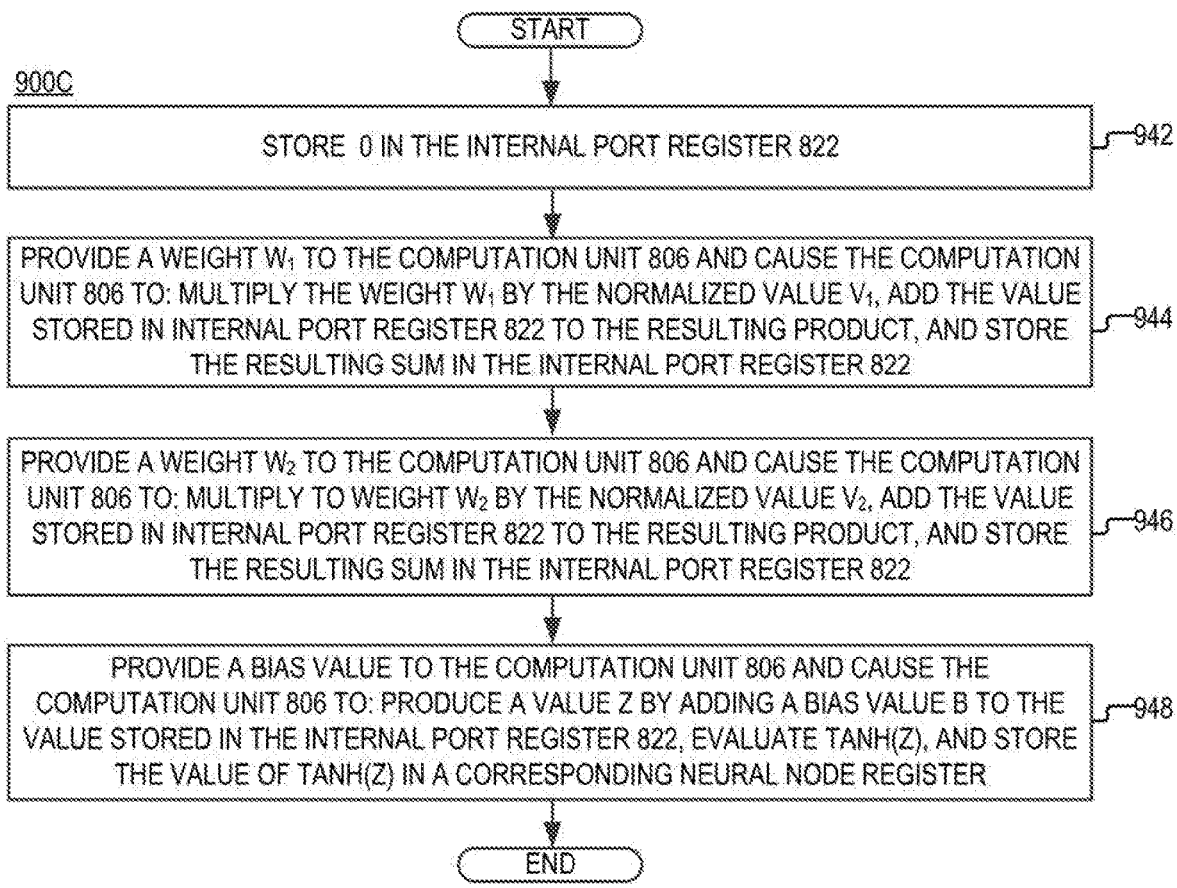
FIG. 9C is a flowchart of an example of a process, according to aspects of the disclosure.

FIG. 9C is a flowchart of an example of a process 900C for evaluating any of the neurons 702, 704, 706, and 708 of the neural network 700, as specified by steps 906-912 of the process 900A. The process 900C is arranged to evaluate the respective affine and activation functions of any of the neurons 702, 704, 706, and 708. In some respects, the operation performed by the process 900 can be described by Equation 17 below:

$$A = \tanh\left(\begin{bmatrix} W_1 \\ W_2 \end{bmatrix}[V_1 \; V_2] + B\right) \quad (\text{Eq. 17})$$

where [W1, W2] is a weight vector that is provided to the computation unit 806 by the control circuitry 808 (and/or the switching circuit 804), B is a bias coefficient that is provided to the computation unit 806 by the control circuitry 808 (and/or the switching circuit 804), $V_1$ is the normalized value stored in the normalized data register 818, and $V_2$ is the normalized value stored in the normalized data register 820. As can be readily appreciated, Equation 17 is a combined representation of the combined affine and activation functions of any of the neurons 702-710.

Figure 9D:
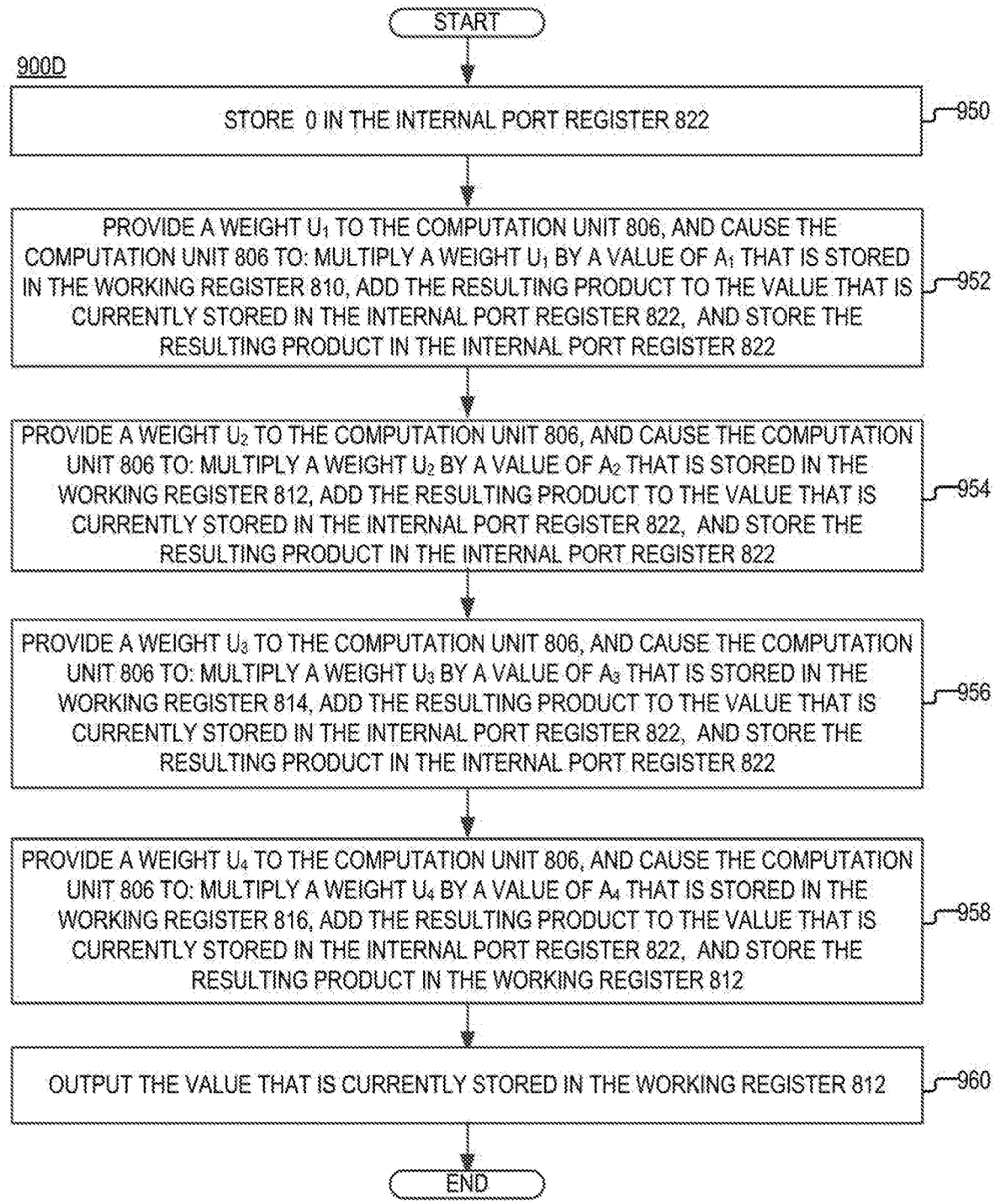
FIG. 9D is a flowchart of an example of a process, according to aspects of the disclosure.

At step 942, the control circuitry 808 causes the computation unit 806 to store the value of '0' in the internal port register 822. At step 944, the control circuitry 808 causes the switching circuit 804 to provide the weight $W_1$ to the computation unit 806. The control circuitry 808 further causes the computation unit 806 to multiply the value $V_1$ by the weight $W_1$. The control circuitry 808 further causes the computation unit 806 to add the resulting product to the value that is currently present in the internal port register 822 (e.g., '0'), and store the resulting sum in the internal port register 822. At step 946, the control circuitry 808 causes the switching circuit 804 to provide the weight $W_2$ to the computation unit 806. The control circuitry 808 further causes the computation unit to multiply the value $V_2$ by the weight $W_2$. The control circuitry 808 further causes the computation unit 806 to add the resulting product to the value that is currently present in the internal port register 822 (e.g., the value calculated at step 944), and store the resulting sum in the internal port register 822. At step 948, the control circuitry 808 causes the switching circuit 804 to provide the bias coefficient B to the computation unit 806. The control circuitry 808 further causes the computation unit 806 to add the bias coefficient B to the value that is currently stored in the internal port register 822 (e.g., the value calculated at step 946) to calculate a value Z. The control circuitry 808 further causes the computation unit 806 to calculate the value of tanh(Z) and store the value of tanh(Z) in one of the neural node registers 810-816, FIG. 9D is a flowchart of an example of a process 900D for calculating the value $V_{out}$ as specified by step 914 of the process 900A.

At step 950, control circuitry 808 causes the computation unit 806 to store the value of '0' in the internal port register 822.

At step 952, the control circuitry 808 causes the switching circuit 804 to provide the weight $U_1$ to the computation unit 806. The control circuitry 808 further causes the computation unit 806 to multiply the weight $U_1$ by the value $A_1$ that is stored in the neural node register 810 and add the resulting product to the value that is currently stored in the internal port register 822 (e.g., '0'), after which the resultant sum is stored in the internal port register 822.

At step 954, the control circuitry 808 causes the switching circuit 804 to provide the weight $U_2$ to the computation unit 806. The control circuitry 808 further causes the computation unit 806 to multiply the weight $U_2$ by the value $A_2$ that is stored in the neural node register 812 and add the resulting product to the value that is currently stored in the internal port register 822 (e.g., '$A_1*U_1$'), after which the resultant sum is stored in the internal port register 822.

At step 956, the control circuitry 808 causes the switching circuit 804 to provide the weight $U_3$ to the computation unit 806. The control circuitry 808 further causes the computation unit 806 to multiply the weight $U_3$ by the value $A_3$ that is stored in the neural node register 814 and add the resulting product to the value that is currently stored in the internal port register 822 (e.g., '$A_i*U_1+A_2*U_2$'), after which the resultant sum is stored in the internal port register 822.

At step 958, the control circuitry 808 causes the switching circuit 804 to provide the weight $U_4$ to the computation unit 806. The control circuitry 808 further causes the computation unit 806 to multiply the weight $U_4$ by the value $A_4$ that is stored in the neural node register 816 and add the resulting product to the value that is currently stored in the internal port register 822 (e.g., '$A_i*U_1+A_2*U_2+A_3*U_3$'), after which the resultant sum is stored in the neural node register 810. As can be readily appreciated, the sum that is calculated at step 958 is the value $V_{out}$.

At step 960, the control circuitry 808 causes the switching circuit 807 to output the value $V_{out}$ that is stored in the neural node register 810.

Figure 10:
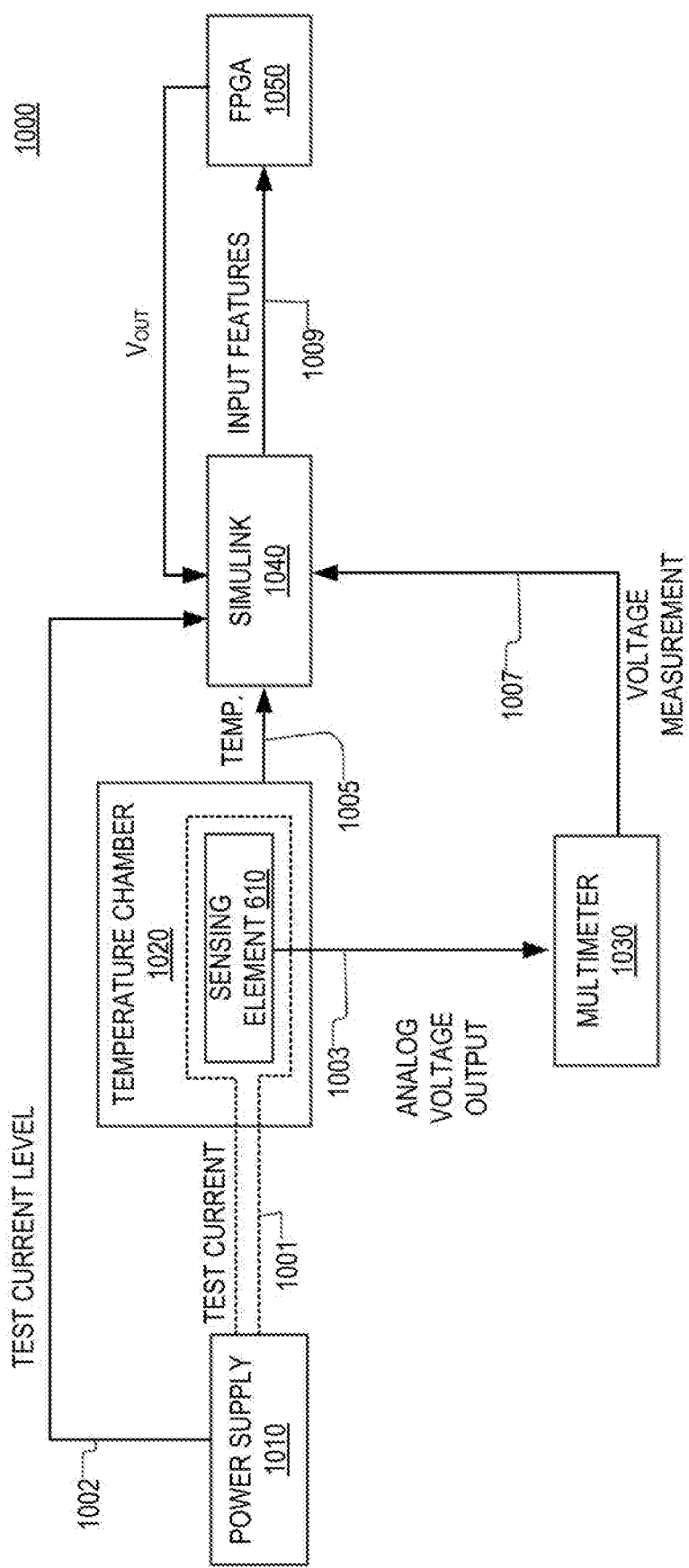
FIG. 10 is a diagram of an example of a system for training the neural network of FIG. 7A.

FIG. 10 is a diagram of an example of a system 1000 for training the neural network 700, according to aspects of the disclosure. The system 1000 is arranged to execute a supervised learning algorithm for training the neural network 700. As used herein, "training the neural network" refers to a process by which values for the weight vectors [$W_{1,1}$, $W_{1,2}$], [$W_{2,1}$, $W_{2,2}$], [$W_{3,1}$, $W_{3,2}$], and [$W_{4,1}$, $W_{4,2}$].

As illustrated, the system 1000 may include a power supply 1010, a temperature chamber 1020, a multimeter 1030, a SIMIULINK module 1040, and an FPGA 1050. According to the example of FIG. 10, the sensing element 610 may be placed inside the temperature chamber 1020. The power supply 1010 may be arranged to generate a current 1001. Furthermore, the power supply 1010 may be arranged to provide a signal 1002 to the SIMIULINK module 1040, which indicates the level of the current 1001. The sensing element 610 may be placed inside the temperature chamber 1020. The sensing element 610 may be arranged to measure the level of the current 1001 and output a voltage signal 1003 that indicates the measured level. The temperature chamber 1020 may be arranged to vary the temperature that is incident on the sensing element 610. The temperature chamber 1020 may be arranged to provide, to the SIMIULINK module 1040, a digital signal 1005 that indicates the temperature that is being applied to the sensing element 610. In some implementations, the temperature chamber 1020 and the power supply 1010 may be arranged to sweep the ambient temperature of the sensing element from −40 C to 150 C for different input currents. The multimeter 1030 may be arranged to receive the voltage signal 1003 that is output from the sensing element 610, measure the level of the voltage signal, and provide, to SIMULINK module 1040, a digital signal 1007 that indicates the level of the voltage signal 1003. The SIMULINK module 1040 may be configured to provide to the FPGA 1050 a set of input features 1009. The input features may include weight vectors [$W_{1,1}$, $W_{1,2}$], [$W_{2,1}$, $W_{2,2}$], [$W_{3,1}$, $W_{3,2}$], and [$W_{4,1}$, $W_{4,2}$] and an input vector [$V_1$, $V_2$]. According to the present example, the value $V_1$ indicates the temperature that is being applied to the sensing element 610 by the temperature chamber 1020, and the value $V_2$ indicates the level of the signal 1003 (that is output from the sensing element 610). The FPGA 1050 may be configured to implement the neural network circuit 640 (see FIGS. 8A-B). The FPGA 1050 may evaluate the neural network 700 based on the input features 1009 and generate an adjusted voltage signal $V_{out}$ as a result. The adjusted voltage signal $V_{out}$ may indicate the level of the current 1001, as measured by the sensing element 610. The SIMULINK module 1040 may determine a distance between the measured level of the current 1001 and the actual level of the current 1001. Based on the distance, the SIMULINK module 1040 may generate an updated set of weight vectors [$W_{1,1}$, $W_{1,2}$], [$W_{2,1}$, $W_{2,2}$], [$W_{3,1}$, $W_{3,2}$], and [$W_{4,1}$, $W_{4,2}$], and provide the updated weight vectors to the FPGA 1050 along with a new input vector [$V_1$, $V_2$]. Afterwards, the signal $V_{out}$ may again be compared to the actual level of the current 1001, and the same cycle is repeated until the distance between the measured level of the current 1001 (as indicated by the signal $V_{out}$) and the actual level of the current 1001 has fallen below a predetermined threshold.

Although in the example of FIG. 10 the system 1000 is used to train the neural network 700, alternative implementations are possible in which the system 1000 is used to train the neural network 200 instead. In such implementations, the FPGA 1050 may be configured to implement the neural network circuit 140, and the input features 1009 may include only weight coefficients and values for the temperature inside the temperature chamber 1020. Furthermore, FIG. 10 is provided as an example only. In this regard, it will be understood the present disclosure is not limited to any specific method and/or algorithm for training the neural networks 200 and 700. According to the example of FIG. 10, the sensing element 610 is a GMR element. However, it will be understood that the present disclosure is not limited to the sensing element 610 being a GMR element and/or a magnetic-field-sensing element. As can be readily appreciated, the SIMULINK module 1040 may include a computer (e.g., a desktop, a laptop, a special purpose computer, etc.) that is configured to execute MATHLAB SIMULINK TM.

Figure 11:
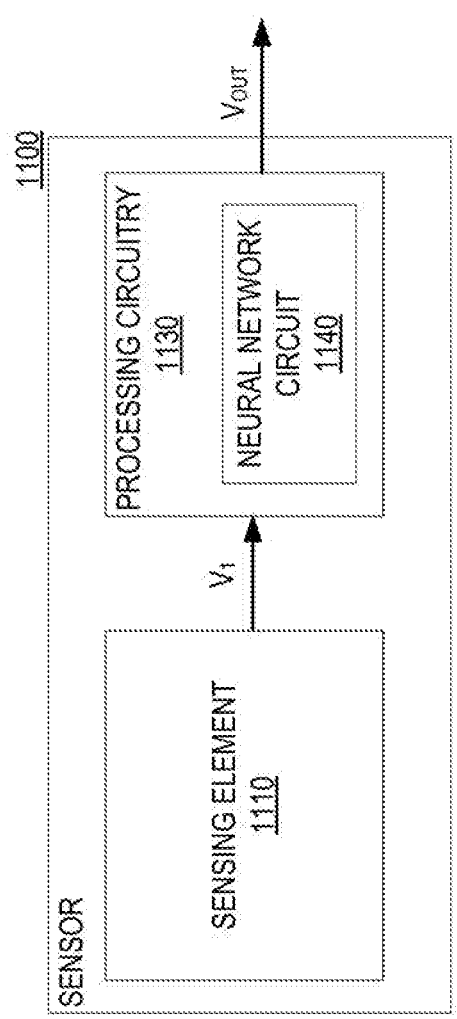
FIG. 11 is a diagram of an example a sensor, according to aspects of the disclosure.

FIG. 11 is a diagram of an example of a sensor 1100, according to aspects of the disclosure. The sensor 1100 may include a magnetic field sensor (e.g., an angle sensor, a current sensor, etc.), a pressure sensor, an optical sensor, a chemical sensor, and/or any other suitable type of sensor. The sensor 1100 may include a sensing element 1110 and a sensing element 120. The sensing element 1110 is arranged to generate a voltage signal $V_1$. The sensing element 1110 may include any suitable type of sensing element, such as a magnetic-field-sensing element, a pressure-sensing element, a light-sensing element (e.g., a photodiode), and/or any other suitable type of sensing element. The sensing element 1110 may be the same or similar to the sensing element 110, which is discussed above with respect to FIG. 1A.

The sensor 1100 may further include a processing circuitry 1130 that includes a neural network circuit 1140. The neural network circuit 1140 may be arranged to adjust the gain and/or offset of the signal $V_1$. For example, in some implementations, the sensing element 1110 may be a magnetic-field-sensing element (e.g., a Hall element, a giant magnetoresistance (GMR) element, a tunnel magnetoresistance (TMR) element, an anisotropic magnetoresistance (AMR) element, a magnetic tunnel junction (MTJ) element, etc.), and the sensing element 120 may be a temperature-sensing element (e.g., a thermistor), etc. In such implementations, the neural network circuit 1140 may adjust the gain of the signal $V_1$ to bring the signal $V_1$ into a desired range or a desired linear range.

The neural network circuit 1140 may implement a neural network. The neural network may include a plurality of hidden nodes and at least one output node. In some implementations, each of the hidden nodes may have an affine function having the form of $Z=W*V_1+B$, where W is a weight corresponding to the hidden node, $V_1$ is a sample corresponding to the signal $V_1$, and B is a bias with the hidden node. B may be equal to zero or different from zero. W may be equal to 1 or different to one. In some implementations, each (or at least two) of the hidden nodes may have a different weight W (or bias B). Furthermore, in some implementations, each of the hidden nodes may have an activation function having the form of $A=TANH(Z)$, where Z is the value of the node's respective affine function. And still furthermore, in some implementations, the output node may have an activation function having the form of $C=\Sigma A_i U_i$, where Zi is the value of the i-th node's activation function and Ui is a weight corresponding to the i-th node. In some implementations, the neural network may be trained by using the method discussed above with respect to FIG. 10, which is discussed above.

Reference herein to "one embodiment" or "an embodiment" means that a particular feature, structure, or characteristic described in connection with the embodiment can be included in at least one embodiment of the claimed subject matter. The appearances of the phrase "in one embodiment"

in various places in the specification are not necessarily all referring to the same embodiment, nor are separate or alternative embodiments necessarily mutually exclusive of other embodiments. The same applies to the term "implementation." Although FIGS. 1B, 6A, and 11 show neural network circuits as being integrated with sensing elements in the same sensor, alternative implementations are possible in which any of the neural network circuits discussed throughout the disclosure is separate of any sensing elements that provide signals to that neural network circuit.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing and claiming the invention and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program. Such software may be employed in, for example, a digital signal processor, micro-controller, or general-purpose computer.

Some embodiments might be implemented in the form of methods and apparatuses for practicing those methods. Described embodiments might also be implemented in the form of program code embodied in tangible media, such as magnetic recording media, optical recording media, solid-state memory, floppy diskettes, CD-ROMs, hard drives, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a general-purpose processor, the program code segments combine with the processor to provide a unique device that operates analogously to specific logic circuits. Described embodiments might also be implemented in the form of a bitstream or other sequence of signal values electrically or optically transmitted through a medium, stored magnetic-field variations in a magnetic recording medium, etc., generated using a method and/or an apparatus of the claimed invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed invention might be made by those skilled in the art without departing from the scope of the following claims.

The invention claimed is:

1. A sensor, comprising:
a first sensing element that is arranged to generate, at least in part, a first signal;

a second sensing element that is arranged to generate, at least in part, a second signal, the second signal being indicative of an environmental condition; and a neural network circuit implementing a neural network that is configured to adjust the first signal based on the second signal, the neural network circuit including a control circuitry, a computation unit, a plurality of registers, and a first switching circuitry that is configured to couple the plurality of registers to the computation unit, the computation unit including an addition unit, a lookup table, and a second switching circuitry that is configured to couple to one another the plurality of registers, the addition unit, and the lookup table, the second switching circuitry being configured to provide, at least in part, a first data path that passes through the lookup table and extends from the addition unit to the plurality of registers, and a second data path that extends from the addition unit through the plurality of registers without passing through the lookup table, the control circuitry being configured to:
(i) cause the second switching circuitry to route, to the lookup table, each of a plurality of affine function values that are calculated by the addition unit,
(ii) cause the second switching circuitry to route, to a different one of the plurality of registers, each of a plurality of activation function values that are retrieved by the lookup table, each of the plurality of activation function values being retrieved based on a different one of the plurality of affine function values in a same clock cycle with the addition unit performing a last calculation of the affine function,
(iii) cause the second switching circuitry to route, to the addition unit, each of the plurality of activation function values from a different one of the plurality of registers, and
(iv) cause a calculation of a weighted sum of the plurality of activation function values so as to produce a value of the first signal that is corrected for changes in sensitivity of the first sensing element that are caused by the environmental condition,
wherein each of the plurality of activation function values corresponds to a different one of a plurality of neurons in a hidden layer of the neural network, and each of the plurality of affine function values also corresponds to a different one of the plurality of neurons in the hidden layer of the neural network.

2. The sensor of claim 1, wherein the environmental condition includes at least one of temperature, humidity, and stress.

3. The sensor of claim 1, wherein the first sensing element includes a Giant Magnetoresistance (GMR) element, and the second sensing element includes a temperature sensing element.

4. The sensor of claim 1, wherein each of the plurality of activation function values is calculated in accordance with the equation of:

$A = \tan h(Z)$ where A is the activation function value, and Z is one of the plurality of affine function values based on which the activation function value is calculated.

5. A sensor, comprising:
a first sensing element that is arranged to generate, at least in part, a first signal, the first sensing element being one of a magnetic field sensing element, a pressure sensing element, or a light-sensing element;

a second sensing element that is arranged to generate, at least in part, a second signal, the second signal being indicative of an environmental condition; and a neural network circuit implementing a neural network that is configured to adjust the first signal based on the second signal, the neural network circuit including a control circuitry, a computation unit, a plurality of registers, and a first switching circuitry that is configured to couple the plurality of registers to the computation unit, the computation unit including an addition unit, a lookup table, and a second switching circuitry that is configured to couple to one another the plurality of registers, the addition unit, and the lookup table, the second switching circuitry being configured to provide, at least in part, a first data path that passes through the lookup table and extends from the addition unit to the plurality of registers, and a second data path that extends from the addition unit through the plurality of registers without passing through the lookup table, the control circuitry being configured to:
(i) cause the second switching circuitry to route, to the lookup table, each of a plurality of affine function values that are calculated by the addition unit, each of the plurality of affine function values being a weighted sum of a sample of the first signal and a sample of the second signal,
(ii) cause the second switching circuitry to route, to a different one of the plurality of registers, each of a plurality of activation function values that are retrieved by the lookup table, each of the plurality of activation function values being retrieved based on a different one of the plurality of affine function values in a same clock cycle with the addition unit performing a last calculation of the affine function,
(iii) cause the second switching circuitry to route, to the addition unit, each of the plurality of activation function values from a different one of the plurality of registers, and
(iv) cause calculation of a weighted sum of the plurality of activation function values so as to produce a value of the first signal that is corrected for changes in sensitivity of the first sensing element that are caused by the environmental condition,
wherein each of the plurality of activation function values corresponds to a different one of a plurality of neurons in a hidden layer of the neural network, and each of the plurality of affine function values also corresponds to a different one of the plurality of neurons in the hidden layer of the neural network.

6. The sensor of claim 5, wherein each of the plurality of activation function values is calculated in accordance with the equation of:

$A = \tan h(Z)$ where A is the activation function value, and Z is one of the plurality of affine function values based on which the activation function value is calculated.

7. The sensor of claim 5, wherein the first sensing element includes a magnetic field sensing element.

8. The sensor of claim 5, wherein the hidden layer is the only hidden layer in the neural network.

9. The sensor of claim 8, wherein the second sensing element is integrated into the sensor or is separate from the sensor.

10. The sensor of claim 8, wherein each of the affine function values is calculated in accordance with the equation of:

$$Z = [W_1 \ W_2]\begin{bmatrix} V_1 \\ V_2 \end{bmatrix} + B$$

where $W_1$ is a first weight value, $W_2$ is a second weight value, $V_1$ is a sample of the first signal, $V_2$ is a sample of the second signal, and B is a bias coefficient.

11. The sensor of claim 8, wherein the environmental condition includes one of temperature, humidity, and stress.

\* \* \* \* \*